United States Patent
Li et al.

(10) Patent No.: US 11,848,684 B2
(45) Date of Patent: Dec. 19, 2023

(54) METHOD, SYSTEM, DEVICE AND STORAGE MEDIUM FOR CONSTRUCTING BASE MATRIX OF PBRL LDPC CODE

(71) Applicant: CHONGQING UNIVERSITY, Chongqing (CN)

(72) Inventors: Yong Li, Chongqing (CN); Hao Yan, Chongqing (CN)

(73) Assignee: CHONGQING UNIVERSITY, Chongqing (CN)

(*) Notice: Subject to any disclaimer, the term of this patent is extended or adjusted under 35 U.S.C. 154(b) by 0 days.

(21) Appl. No.: 17/445,732

(22) Filed: Aug. 24, 2021

(65) Prior Publication Data
US 2023/0087247 A1 Mar. 23, 2023

(30) Foreign Application Priority Data
Aug. 16, 2021 (CN) .......................... 202110939671.4

(51) Int. Cl.
 *H03M 13/11* (2006.01)
 *H03M 13/00* (2006.01)

(52) U.S. Cl.
 CPC .... *H03M 13/1162* (2013.01); *H03M 13/1117* (2013.01); *H03M 13/1174* (2013.01); *H03M 13/616* (2013.01)

(58) Field of Classification Search
 CPC .......... H03M 13/1174; H03M 13/116; H03M 13/1162; H03M 13/1117; H03M 13/616
 See application file for complete search history.

(56) References Cited

U.S. PATENT DOCUMENTS

| | | | | |
|---|---|---|---|---|
| 2005/0204253 A1* | 9/2005 | Sukhobok | ............ | H03M 13/118 714/752 |
| 2019/0334559 A1* | 10/2019 | Panteleev | .......... | H03M 13/1137 |
| 2019/0349003 A1* | 11/2019 | Usatyuk | .............. | H03M 13/616 |

OTHER PUBLICATIONS

Y. Xie, J. Yuan and Q. T. Sun, "Design of Quantum LDPC Codes From Quadratic Residue Sets," in IEEE Transactions on Communications, vol. 66, No. 9, pp. 3721-3735, Sep. 2018, doi: 10.1109/TCOMM.2018.2827945.*

K. Liu, Z. Fei and J. Kuang, "Two Algebraic Methods for Constructing Efficiently Encodable Quasi-Cyclic LDPC Codes," 2008 4th International Conference on Wireless Communications, Networking and Mobile Computing, 2008, pp. 1-4, doi: 10.1109/WiCom. 2008.360.*

T.-Y. Chen, K. Vakilinia, D. Divsalar and R. D. Wesel, "Protograph-Based Raptor-Like LDPC Codes," in IEEE Transactions on Communications, vol. 63, No. 5, pp. 1522-1532, May 2015, doi: 10.1109/TCOMM.2015.2404842.*

(Continued)

*Primary Examiner* — Steve N Nguyen
(74) *Attorney, Agent, or Firm* — METIS IP LLC

(57) ABSTRACT

The present disclosure relates to a method, system, and non-transitory computer-readable storage medium for constructing a base matrix of a PBRL LDPC code, comprising: determining at least one candidate sub-matrix of a PBRL LDPC code based on a base matrix of a QR-QC-LDPC code; obtaining at least one count of cycles with at least one preset length for each of the at least one candidate sub-matrix; and determining a first sub-matrix of the base matrix of the PBRL LDPC code based on the at least one count of cycles.

13 Claims, 12 Drawing Sheets

(56) References Cited

OTHER PUBLICATIONS

K. Vakilinia, D. Divsalar and R. D. Wesel, "Protograph-based Raptor-like LDPC codes for the binary erasure channel," 2015 Information Theory and Applications Workshop (ITA), 2015, pp. 240-246, doi: 10.1109/ITA.2015.7308995.*

S. V. S. Ranganathan, D. Divsalar and R. D. Wesel, "Quasi-Cyclic Protograph-Based Raptor-Like LDPC Codes for Short Block-Lengths," in IEEE Transactions on Information Theory, vol. 65, No. 6, pp. 3758-3777, Jun. 2019, doi: 10.1109/TIT.2019.2895322.*

T.-Y. Chen, D. Divsalar, J. Wang and R. D. Wesel, "Protograph-Based Raptor-Like LDPC Codes for Rate Compatibility with Short Blocklengths," 2011 IEEE Global Telecommunications Conference—GLOBECOM 2011, 2011, pp. 1-6, doi: 10.1109/GLOCOM.2011.6134051.*

Anyong Qing, "Fundamentals of Differential Evolution," in Differential Evolution: Fundamentals and Applications in Electrical Engineering , IEEE, 2009, pp. 41-60.*

R. G. Gallager, Low-Density Parity-Check Codes, IRE Transactions on Information Theory, 8(1): 21-28, 1962.

Kyung-Joong Kim et al., Low-Density Parity-Check Codes for ATSC 3.0, IEEE Transactions on Broadcasting, 62(1): 189-196, 2016.

Tom Richardson et al., Design of Low-Density Parity Check Codes for 5G New Radio, IEEE Communications Magazine, 56(3): 28-34, 2018.

Wang, Bingbing et al., Two Effective Scheduling Schemes for Layered Belief Propagation of 5G LDPC Codes, IEEE Communications Letters, 24(8): 1683-1686, 2020.

Maximilian Stark et al., Decoding Rate-Compatible 5G-LDPC Codes With Coarse Quantization Using the Information Bottleneck Method, IEEE Open Journal of the Communications Society, 1(1): 646-660, 2020.

Zhong, Zhiwei et al., A Flexible and High Parallel Permutation Network for 5G LDPC Decoders, IEEE Transactions on Circuits and Systems—II: Express Briefs, 67(12): 3018-3022, 2020.

Kang, Peng et al., Enhanced Quasi-Maximum Likelihood Decoding Based on 2D Modified Min-Sum Algorithm for 5G LDPC Codes, IEEE Transactions on Communications, 68(11): 6669-6682, 2020.

Nam-Il Kim et al., A Modified Min Sum Decoding Algorithm based on Approximation Enhancement for LDPC Codes, 2020 International Conference on Information and Communication Technology Convergence (ICTC), 1407-1410, 2020.

Cui, Hangxuan et al., Design of High-Performance and Area-Efficient Decoder for 5G LDPC Codes, IEEE Transactions on Circuits and Systems—I: Regular Papers, 68(2): 879-891, 2021.

Li, Liguang et al., LDPC Design for 5G NR URLLC & mMTC, 2020 International Wireless Communications and Mobile Computing (IWCMC), 1071-1076, 2020.

Li, Yong et al., Construction of Quasi-Cyclic Low-Density Parity-Check Codes Based on Quadratic Residue Codes, 2021 15th International Symposium on Medical Information and Communication Technology (ISMICT), 157-161, 2021.

Li, Juane et al., Construction of Partial Geometries and LDPC Codes Based on Reed-Solomon Codes, 2019 IEEE International Symposium on Information Theory (ISIT), 61-65, 2019.

Xu, Hengzhou et al., Construction of Quasi-Cyclic LDPC Codes via Masking with Successive Cycle Elimination, IEEE Communications Letters, 20(12): 2370-2373, 2016.

Tian, Tao et al., Selective Avoidance of Cycles in Irregular LDPC Code Construction, IEEE Transactions on Communications, 52(8): 1242-1247, 2004.

Suhwang Jeong et al., On the Design of Multi-Edge Type Low-Density Parity-Check Codes, IEEE Transactions on Communications, 67(10): 6652-6667, 2019.

M. P. C. Fossorier, Quasi-Cyclic Low-Density Parity-Check Codes from Circulant Permutation Matrices, IEEE Transactions on Information Theory, 50(8): 1788-1793, 2004.

Li, Zongwang et al., A Class of Good Quasi-Cyclic Low-Density Parity Check Codes Based on Progressive Edge Growth Graph, Conference on Signals, Conference Record of the Thirty-Eighth Asilomar Conference on Signals, Systems and Computers, 1990-1994, 2004.

C. T. Healy et al., Design of LDPC Codes Based on Multipath EMD Strategies for Progressive Edge Growth, IEEE Transactions on Communications, 64(8): 3208-3219, 2016.

Mehdi Karimi et al., Efficient Algorithm for Finding Dominant Trapping Sets of LDPC Codes, IEEE Transactions on Information Theory, 58(11): 6942-6958, 2012.

Zhang, Wenyan et al., Construction of SeIRA QC-LDPC Codes with Low Error Floor, 2011 8th International Symposium on Wireless Communication Systems, 457-461, 2011.

5G NR, Multiplexing and Channel Coding, 101 pages, 2018.

Sachini Jayasooriya et al., A Joint Optimization Technique for Multi-Edge Type LDPC Codes, IET Communications, 2016, 22 pages.

Tom Richardson, Multi-Edge Type LDPC Codes, 2004, 36 pages.

* cited by examiner

400

Obtain the column permutation matrix based on a permutation rule /∼410

Obtain the base matrix of the PBRL LDPC code by permuting the first sub-matrix and the second sub-matrix based on the column permutation matrix /∼420

FIG. 4

Tanner Graph $$H_x = \begin{bmatrix} 1 & 1 & 0 & 1 & 1 & 0 \\ 1 & 0 & 1 & 0 & 1 & 1 \\ 0 & 1 & 1 & 1 & 0 & 1 \end{bmatrix}$$

1010

$$H_y = \begin{bmatrix} 1 & 0 & 1 \\ 1 & 1 & 0 \\ 0 & 1 & 1 \end{bmatrix}$$

METHOD, SYSTEM, DEVICE AND STORAGE MEDIUM FOR CONSTRUCTING BASE MATRIX OF PBRL LDPC CODE

CROSS REFERENCE

This application claims priority of Chinese Patent Application No. 202110939671.4 filed on Aug. 16, 2021, the entire contents of which are hereby incorporated by reference.

TECHNICAL FIELD

This specification disclosure relates to the field of communication systems, and more particularly to methods, systems, devices, and storage mediums for constructing a base matrix of PBRL LDPC code.

BACKGROUND

Low-Density Parity-Check (LDPC) code is a packet error correction code with a sparse check matrix, and it is suitable for almost all channels, hence it has become a research hotspot in recent years. However, due to its complicated coding, as well as the fact that LDPC code can only demonstrate superiority in performance when its code length is long, the time delay of coding has been relatively obvious. For LDPC codes, the structure of the check matrix is an important factor affecting its performance. Since the length distributions of the cycles in the bipartite graph have significant impact on the code performance, it is critical for code performance to construct the check matrix based on the cycles.

Therefore, it is necessary to propose a method for constructing a base matrix of a PBRL LDPC code, through which a check matrix of the LDPC code can be constructed based on the length distributions of the cycles, thereby increasing the performance of the LDPC code.

SUMMARY

One aspect of the present specification provides a method for constructing a base matrix of a PBRL LDPC code, comprising: determining at least one candidate sub-matrix of a PBRL LDPC code based on a base matrix of a QR-QC-LDPC code; obtaining at least one count of cycles with at least one preset length for each of the at least one candidate sub-matrix; and determining a first sub-matrix of the base matrix of the PBRL LDPC code based on the at least one count of cycles.

One aspect of the present specification provides a system for constructing a base matrix of a PBRL LDPC code, comprising: a setting module, configured to determine at least one candidate sub-matrix of a PBRL LDPC code based on a base matrix of a QR-QC-LDPC code; a calculation module, configured to obtain at least one count of cycles with at least one preset length for each of the at least one candidate sub-matrix; and a determination module, configured to determine a first sub-matrix of the base matrix of the PBRL LDPC code based on the at least one count of cycles.

One aspect of the present specification provides a device for constructing a base matrix of a PBRL LDPC code, comprising at least one storage medium and at least one processor, the at least one storage medium is configured to store computer instructions; the at least one processor is configured to perform the computer instruction to achieve the method for constructing a base matrix of a PBRL LDPC code.

One aspect of the present specification provides a computer readable storage medium characterized in that the memory media stores computer instructions that implement the method for constructing a base matrix of a PBRL LDPC code when the computer instruction is performed by the processor.

BRIEF DESCRIPTION OF THE DRAWINGS

The present disclosure is further described in terms of exemplary embodiments. These exemplary embodiments are described in detail with reference to the drawings. The drawings are not to scale. These embodiments are non-limiting exemplary embodiments, in which like reference numerals represent similar structures throughout the several views of the drawings, and wherein:

FIG. 4 is a flowchart illustrating an exemplary process for permuting the first sub-matrix and the second sub-matrix based on a column permutation matrix according to some embodiments of the present disclosure;

FIG. 10 is an exemplary graph of a length of a cycle according to some embodiments of the present disclosure;

DETAILED DESCRIPTION

Figure 1:
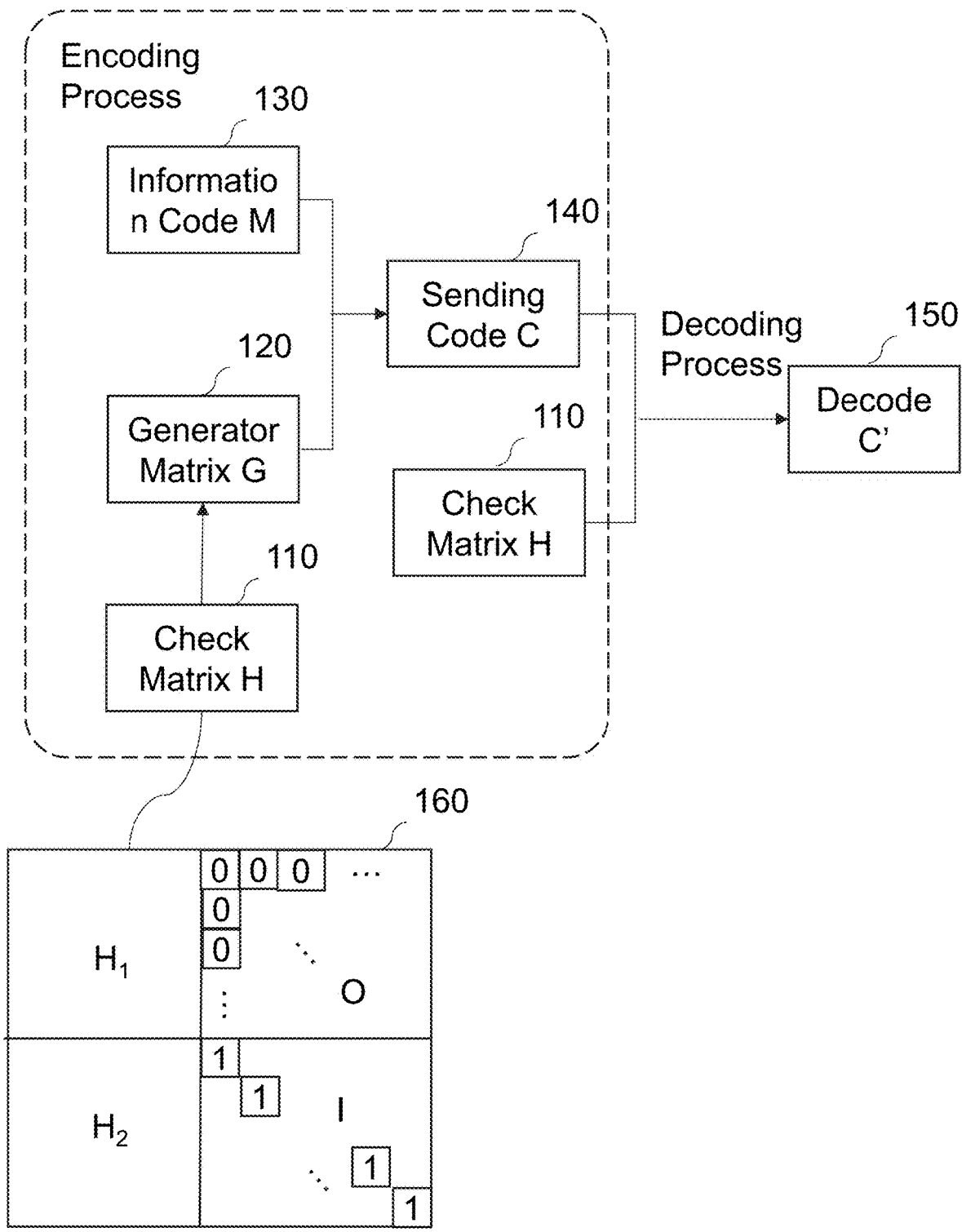
FIG. 1 is an exemplary graph of a base matrix of a PBRL LDPC code according to some embodiments of the present disclosure.

To better illustrate the technical solutions presented in the embodiments of the present specification, a brief introduction to the necessary drawings that describe the embodiments will be presented in the following. Obviously, the drawings in the following descriptions are merely examples or embodiments of the present specification. Based on the drawings, the present specification may be applied in other similar scenarios without creative labor by a person having ordinary skill in the art. Unless obvious in context or otherwise stated, the same numeral in the drawings refers to the same structure or operation.

The terms "system", "device", "unit", and/or "module" used herein are a method for distinguishing different components, elements, components, partial or assemblies of different levels. However, if other words may achieve the same purpose, the words may be displaced by other expressions.

As shown in the present specification and claims, unless the context clearly prompts the exception, the terms "a", "an", "one", and/or "this" are not specifically singular, and the plural forms may be included. In general, the terms "comprise", "comprises", and/or "comprising", "include", "includes", and/or "including" merely specify the presence of stated steps and/or features, but do not imply a combination of steps and/or features precluding additional steps and/or features, i.e., the corresponding methods or devices may also include other steps and/or features.

Flowcharts are used in this specification to illustrate the operations performed by the corresponding system in the embodiments of the present specification. The steps may not necessarily be performed in the order shown on the flowcharts. Instead, various steps may be performed in reverse order or simultaneously. Moreover, additional steps may be added to the operations, and one or more steps may be removed from the operations.

In a typical communication process, data (e.g., speech signal, image signal, baseband signal) is transmitted after being encoded. At the transmitting terminal, the encoded data may be obtained by increasing the redundancy (e.g., adding check codes) to the original data using an encoder. At the receiving terminal, the decoded data may be obtained by decoding the received data based on certain rules and restoring the original information or data using a decoder. Through the encoding and decoding processes, the system may gain the capability of error correction and anti-interference to a certain extent, which may greatly reduce error codes in transmitting code streams.

An aspect of the present specification provides a method of encoding and decoding based on a LDPC code.

FIG. 1 is an exemplary graph of a base matrix of a PBRL LDPC code according to some embodiments of the present disclosure. In some embodiments, a system for constructing a base matrix of a PBRL LDPC code may be applied in a LDPC encoder to process data. For example, the system for constructing the base matrix of the PBRL LDPC code may be applied in a channel encoder to encode data. For another example, the system for constructing the base matrix of the PBRL LDPC code may be applied in a channel decoder to decode data.

A channel encoder improves the ability of the data receiver to identify errors by encoding the information sequence, thereby reducing the error rate to improve the quality of information recovery. Generally, the method of encoding is to add additional codes (i.e., check codes) to the information codes, and therefore the codes transmitted by the channel is the information codes and the check codes combined.

A channel decoder is configured to decode the received codes based on a certain rule, and discover errors or correct errors during the decoding process, thereby increasing the anti-interference capability of the communication system and achieving reliable communication.

Low-Density Parity-Check (LDPC) code is a packet with a sparse check matrix, which is one of the channel error correction codes. The sparsity of the check matrix ensures its decoding complexity and that the smallest code distance linearly increases with the code length.

The LDPC code is a type of linear block code. The transmitting codes are composed of the information codes and the check codes, and error correction and decoding are performed at the receiving terminal based on a certain rule associated with the check codes and the information codes.

The information codes, the check codes, and the transmitting codes may be encoded signals, which may be expressed as binary codes. The information codes may be the original data in source data. The check codes may be codes added during the encoding process to increase the redundancy of the original data. The transmitting codes may be obtained by combining the information codes and the check codes based on a certain rule. Let m denotes the length of the check codes, k denotes the length of the information codes, n denotes the length of the transmitting codes, then n=m+k.

As shown in FIG. 1, a LDPC code is typically represented by a check matrix H (110), and the encoding process of the LDPC code is a constructing process of the check matrix H. During the encoding process of the LDPC code, a generator matrix G (120) may be obtained by transforming the check matrix H, and a transmitting code C (140) may be obtained by multiplying an information code M (130) by the generator matrix G. The check matrix H and the generator matrix G have a transposition relationship. For example, the check matrix H may consist of a matrix Q of size r×k and an identity matrix I of size r×r, denoted as $H=[Q_{rk}\ I_r]$, and the generator matrix G may be obtained based on the transposition relationship $G*H^T=0$ and denoted as $G=[I_k\ Q_{rk}^T]$. The decoding process of the LDPC code is an iterative decoding process based on the check matrix H, which is to iterate the information data in the check matrix H based on a check rule between the check codes and the information codes, until a code that satisfies $C*H^T=0$ is found. Such a code corresponds to the decoded information C' (150).

During the LDPC decoding process, the check matrix H may be configured to verify whether the transmitting code C received by the receiving terminal has an error in the transmission. Specifically, if $C*H^T=0$, then there is no error in the transmission; if $C*H^T \neq 0$, then there is the error in the transmission.

The check matrix H may be constructed using a structured construction method. A Quasi-Cyclic Low-Density Parity-Check (QC-LDPC) code is a special type of LDPC code, which is an important code of the structured construction method and is constructed by a square matrix with a cyclic structure. One important step of constructing a QC-LDPC code is to construct the base matrix $B_{QC}$ of the check matrix $H_{QC}$. The base matrix $B_{QC}$ of the check matrix $H_{QC}$ may be constructed by a finite field or other manner, and then permuted based on an extension factor q. Specifically, the elements of −1 in the base matrix $B_{QC}$ are permuted by an all zero matrix of size q×q, the elements of 0 in the base matrix $B_{QC}$ are permuted by an identity matrix of size q×q, and the remaining elements in the base matrix $B_{QC}$ are permuted by a Circulant Permutation Matrix (CPM), wherein each row of the CPM may be generated by circular shift of the first row.

In 5G wireless communications, the LDPC code with a Protograph-based Raptor-Like (PBRL) structure is a rate-compatible type LDPC code. The PBRL structure is primarily used in binary codes for the BI-WAGN channel. The LDPC code with the PBRL structure is denoted as a PBRL LDPC code in this specification.

As shown in FIG. 1, the check matrix H of the PBRL LDPC code may be denoted as a check matrix $$H_{PBRL\ LDPC} = \begin{bmatrix} H_1 & 0 \\ H_2 & I \end{bmatrix}.$$

The detailed structure of the check matrix $H_{PBRL\ LDPC}$ is as shown in 160, which consists of four parts: a first check matrix $H_1$, a second check matrix $H_2$, an all zero matrix O, and an identity matrix I. The structure of the check matrix $H_{PBRL\ LDPC}$ may be constructed based on the QC-LDPC code. Assuming that the first check matrix $H_1$ consists of q×q CPMs and may be represented by a base matrix $B_1$ of size a×b, wherein $$B_1 = \begin{bmatrix} \beta_{1,1} & \cdots & \beta_{1,b} \\ \vdots & \ddots & \vdots \\ \beta_{a,1} & \cdots & \beta_{a,b} \end{bmatrix},$$

and $\beta_{1,1}, \ldots, \beta_{a,b}$ are the CPMs; the second check matrix $H_2$ consists of q×q CPMs and may be represented by a base matrix $B_2$ of size f×b, wherein $$B_2 = \begin{bmatrix} \beta_{1,1} & \cdots & \beta_{1,b} \\ \vdots & \ddots & \vdots \\ \beta_{f,1} & \cdots & \beta_{f,b} \end{bmatrix},$$

wherein $\beta_{1,1}, \ldots, \beta_{f,b}$ are the CPMs; the size of the all zero matrix O is a zero matrix of size qa×qf; and the identity matrix I is an identity matrix of size qa×qf.

In some embodiments, a determination module 830 may obtain the second sub-matrix $B_2$ based on the first sub-matrix $B_1$.

The base matrix of the PBRL LDPC code constructed based on the disclosure in this specification may be applied to the encoding and decoding of LDPC codes for wired communication, wireless communication, or flash memory channel.

The base matrix of the PBRL LDPC code may be generated by a processor. The encoding process and the decoding process of the PBRL LDPC code may be implemented by computing devices. The check results of the PBRL LDPC code may be output and stored by the computing devices.

It should be noted that the above description of the system for constructing the base matrix of the PBRL LDPC code is intended to be illustrative, and not to limit the scope of the present disclosure. A person having ordinary skill in the art, with understanding of the principles behind the system above and without deviating from these principles, may combine different parts of the system in any order and/or create a sub-system and connect it with other parts.

Figure 2:
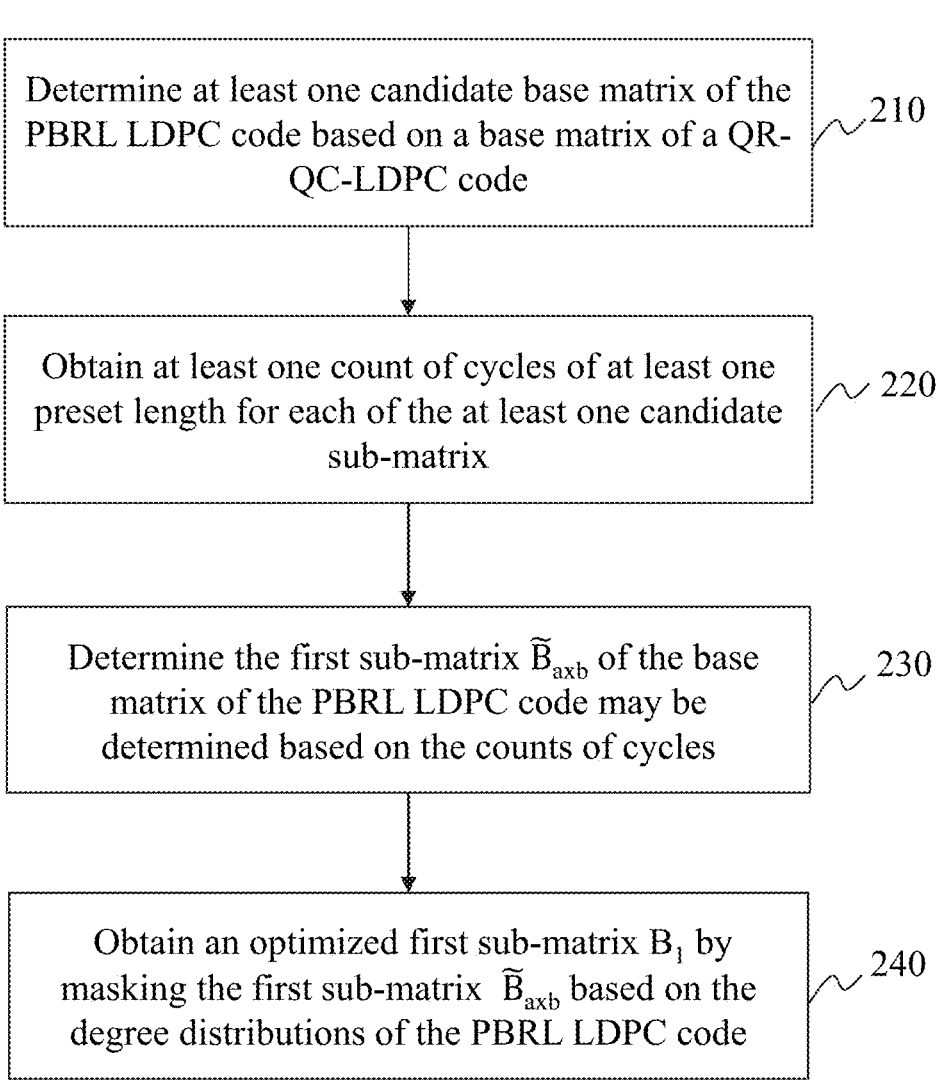
FIG. 2 is a flowchart illustrating an exemplary process for constructing a first sub-matrix of the base matrix of the PBRL LDPC code according to some embodiments of the present disclosure.

FIG. 2 is a flowchart illustrating an exemplary process for constructing the first sub-matrix of the base matrix of the PBRL LDPC code according to some embodiments of the present disclosure.

In step 210, at least one candidate sub-matrix of the PBRL LDPC code may be determined based on a base matrix of a QR-QC-LDPC code.

In some embodiments, the step 210 may be performed by a setting module 810.

The QR-QC-LDPC code is a type of QC-LDPC code constructed based on a Quadratic Residue (QR) code.

The QR code is a type of linear packet code in the finite field, and it has an algebraic structure, a large minimum Hamming distance, and a good error correction capability.

For a (n, k) QR code, n denotes the total length of the codes of the QR code; k denotes the length of the information codes of the QR code, indicating that the QR code has k information bits; n-k denotes the length of check codes of the QR code, indicating the QR code has n-k check bits. For example, a (7, 3) QR code may include 3 information codes $u_2$, $u_1$, and $u_0$, and subsequently 7−3=4 check codes $v_3$, $v_2$, $v_1$, and $v_0$, hence the QR code may be denoted as $(c_6, c_5, c_4, c_3, c_2, c_1, c_0)=(u_2, u_1, u_0, v_3, v, v_1, v_0)$.

The setting module 810 may obtain the base matrix of the QR-QC-LDPC code based on the total length of the codes and the length of the information codes of the QR code. Specifically, assuming that the total length of the codes of the QR code is n, the length of the information codes of the QR code is k, then the length of the check codes of the QR code is m=n−k. For the QR code, a squared residue module may be expressed as $Q_n$:

$$Q_n = \{i | i \equiv j^2 \bmod n, \text{ for } 1 \le j \le n-1\} \quad (1)$$

The setting module 810 may set the check matrix $H_{QR}$ based on the total length of the codes n and the length of the check codes m:

$$H_{QR,full}^{(n)} = \begin{bmatrix} \beta^{0 \times j1} & \cdots & \beta^{(n-1)j1} \\ \vdots & \ddots & \vdots \\ \beta^{0 \times jm} & \cdots & \beta^{(n-1)jm} \end{bmatrix} \quad (2)$$

wherein $1 \le i \le m = |Q_n|$.

In the formula (2), $\beta$ denotes the elements in the check matrix $H_{QR}$. Since $\beta$ is an n-th root of unity on the extension field GF ($2^\gamma$), we have $\beta^s = \beta^{s \bmod n}$, wherein $$\beta = \alpha^u, u = \frac{2^\gamma - 1}{n},$$

$\gamma$ denotes the smallest positive integer, $\alpha$ denotes a primitive element of the extension field GF ($2^\gamma$), and u denotes a primitive n-th root of unity in GF ($2^\gamma$). Thereby the setting module 810 may rewrite the element $\beta^s$ in the check matrix $H^{(n)}_{QR,full}$ as $\beta^{s \bmod n}$. For example, the setting module 810 may rewrite the element $\beta^{(n-1)j1}$ as $\beta^{(n-1)j1 \bmod n}$, and obtain the rewritten check matrix $H^{(n)}_{QR,\ full}{}'$ as follows:

$$H_{QR,full'}^{(n)} = \begin{bmatrix} \beta^{0 \times j1 \bmod n} & \cdots & \beta^{(n-1)j1 \bmod n} \\ \vdots & \ddots & \vdots \\ \beta^{0 \times jm \bmod n} & \cdots & \beta^{(n-1)jm \bmod n} \end{bmatrix} \quad (3)$$

The setting module 810 may obtain the base matrix $B_{QR}$ of the check matrix $H^{(n)}_{QR,\ full}$ based on the rewritten check matrix $H^{(n)}_{QR,\ full}{}'$:

$$B_{QR} = \begin{bmatrix} 0 & j_1 \bmod n & \cdots & (n-1)j_1 \bmod n \\ \vdots & \vdots & \ddots & \vdots \\ 0 & j_m \bmod n & \cdots & (n-1)j_m \bmod n \end{bmatrix} \quad (4)$$

The setting module 810 may denote the (s, t)-th entry in the base matrix $B_{QR}$ by $B_{s,t}$ and obtain $B_{QR}=\{B_{s,t}\}$, wherein s denotes the rows in the base matrix $B_{QR}$ and t denotes the columns in the base matrix $B_{QR}$. The setting module 810 may permute each $B_{s,t}$ in the base matrix $B_{QR}$ with CPM having a shift value of $B_{s,t}$. For QC-LDPC code, the shift value of $B_{s,t}$ may be formed by cyclically right-shifting the columns of $B_{s,t}$ times. The permuted base matrix $B_{QR}$ obtained by the setting module 810 may be the base matrix of the QC-LDPC code constructed based on the QR code, and is hereafter referred as the base matrix of the QR-QC-LDPC code and denoted by $B_{QR\text{-}QC\text{-}LDPC}$.

The first sub-matrix represents the base matrix of the first check sub-matrix $H_1$ in the check matrix $H_{PBRL\ LDPC}$ of the PBRL LDPC code, denoted by $B_1$. Assume that the first check sub-matrix $H_1$ consists of q×q CPMs and the size of the first sub-matrix $B_1$ is a×b.

In some embodiments, the setting module 810 may determine at least one candidate sub-matrix $B_{a\times b}$ of the PBRL LDPC code based on the base matrix $B_{QR\text{-}QC\text{-}LDPC}$ of the QR-QC-LDPC code. Specifically, assuming the size of the first sub-matrix $B_1$ is a×b, the setting module 810 may select a sub-matrix from the m×n base matrix $B_{QR\text{-}QC\text{-}LDPC}$ such that the sub-matrix has the same size as the first sub-matrix $B_1$, and set the sub-matrix to be the candidate sub-matrix $B_{a\times b}$, wherein m>a and n>b. For example, the setting module 810 may select a sub-matrix of size 4×14 from a 8×17 base matrix $B_{QR\text{-}QC\text{-}LDPC}$, and set the sub-matrix be a candidate sub-matrix $B_{a\times b}$.

In some embodiments, for a base matrix $B_{QR\text{-}QC\text{-}LDPC}$ of size m×n and a candidate sub-matrix $B_{a\times b}$ of size a×b, the maximum count of candidate sub-matrices the setting module 810 may obtain from the base matrix $B_{QR\text{-}QC\text{-}LDPC}$ calculated as below based on the combination formula $$\left(\binom{x}{y}\right) = \frac{x!}{(x-y)!y!} : \binom{m}{a}\binom{n}{b} = \frac{m!}{(m-a)!a!} \cdot \frac{n!}{(n-b)!b!} \quad (5)$$

Considering the QR code has a large minimum Hamming distance and a good error correction capability, the QR-QC-LDPC code constructed based on the QR code may have better error performance, and the candidate sub-matrix $B_{a\times b}$ of the PBRL LDPC code determined based on the QR-QC-LDPC code may provide a better error correction capability for the LDPC code.

In step 220, at least one count of cycles of at least one preset length for each of the at least one candidate sub-matrix may be obtained.

In some embodiments, the step 220 may be performed by a calculation module 812.

One or more cycles may be obtained for each candidate sub-matrix.

The definition of a cycle in the candidate sub-matrix is as follows: a path starting from and ending at a certain node, and only travelling through non-repeating edges. This path made of nodes and edges is a cycle.

Figure 9:
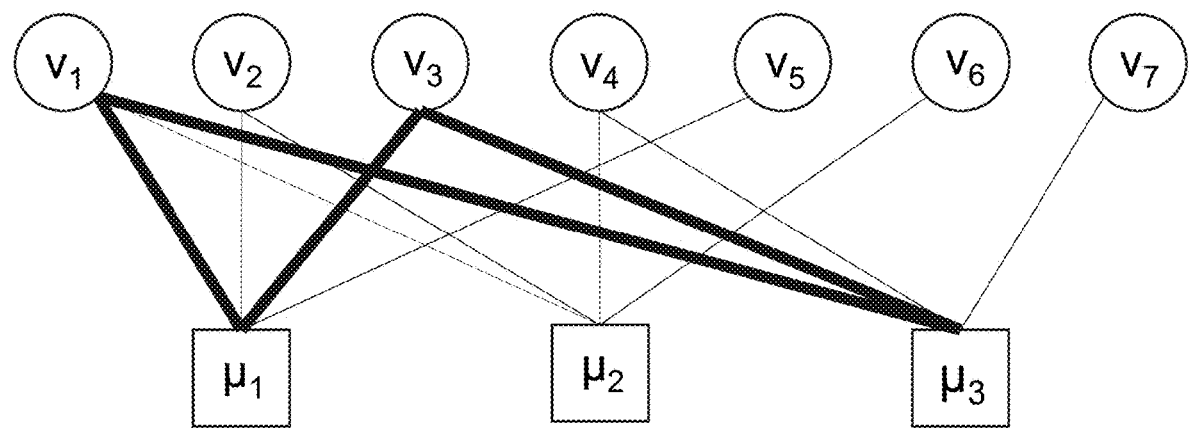
FIG. 9 is an exemplary graph of a Tanner graph according to some embodiments of the present disclosure.

The nodes refer to variable nodes and check nodes in the candidate sub-matrix. The check matrix H may be represented by a Tanner graph. In the Tanner graph, the elements in the check matrix H consist of two types of nodes: the variable nodes and the check nodes. The variable nodes correspond to the columns in the check matrix H, and the check nodes correspond to the rows in the check matrix H. FIG. 9 is an exemplary graph of the Tanner graph according to some embodiments of the present disclosure. As shown in FIG. 9, a Tanner graph of the check matrix $H_z$ is present, wherein $v_1, v_2, \ldots, v_7$ denote the variable nodes, $\mu_1, \mu_2$, and $\mu_3$ denote the check nodes.

The edges refer to lines connecting the variable nodes and the check nodes. In a Tanner graph corresponding to a check matrix H, a line connecting a variable node and a check note corresponds to an element of 1 in the check matrix H. As shown in FIG. 9, the element $(v_1, \mu_1)$ is 1 in the check matrix $H_z$, which corresponds to a line between the variable node $v_1$ and the check node $\mu_1$ in the Tanner graph. This line is referred to as an edge.

The length of a cycle refers to the count of all edges in the cycle. For example, as shown in FIG. 9, a cycle 910 of the check matrix $H_z$ has the following path $v_1 \to \mu_1 \to v_3 \to \mu_3 \to v_1$, which means the cycle contains 4 edges, and therefore the length of the cycle is 4.

Since the length of a cycle is always an even number and greater than or equal to 4, the length of the cycle may be represented by 2l, wherein l is an integer greater than or equal to 2 (e.g., 2, 3, 4, etc.). For example, when l=2, the length of the cycle is 2l=4; when l=3, the length of the cycle is 3l=6.

FIG. 10 is an exemplary graph of lengths of cycles according to some embodiments of the present disclosure. As shown in FIG. 10, a cycle 1010 is a cycle of the check matrix $H_x$ with a length of 4, and a cycle 1020 is a cycle of the check matrix $H_y$ with the length of 6.

A cycle in a candidate sub-matrix exists if and only if:

$$\sum_{s=1}^{l} (w_{is,js} - w_{is,js+1}) = 0 \bmod q \quad (6)$$

wherein $j_{l+1}=j_1$, q denotes the size of CPM, and $w_{i,j}$ denotes elements in the candidate sub-matrix, wherein $1 \leq i \leq a$ and $1 \leq j \leq b$.

In some embodiments, the calculation module 820 may obtain at least one count of cycles of at least one preset length for each of the at least one candidate sub-matrix. Specifically, the calculation module 820 may obtain the count of cycles of a preset length that pass through the entries in the CPM of the candidate sub-matrix, based on the size of the candidate sub-matrix a×b, the preset length 2l and the size of the CPM q×q.

In some embodiments, the count of cycles of the length 2l that pass through the entry $w_{i,j}$ in the candidate sub-matrix may be represented by $$\theta_{i,j}^{(2l)},$$

and a matrix containing all the entries $$\theta_{i,j}^{(2l)}$$

may be represented by $\theta^{(2l)}$:

$$\theta^{(2l)} = \begin{pmatrix} \theta_{1,1}^{(2l)} & \cdots & \theta_{1,b}^{(2l)} \\ \vdots & \ddots & \vdots \\ \theta_{a,1}^{(2l)} & \cdots & \theta_{a,b}^{(2l)} \end{pmatrix} = \{\theta_{i,j}^{(2l)}\} \quad (7)$$

For example, set l=2, the length of the cycle is 2l=4, then the matrix $\theta^{(4)}$ may be represented by:

$$\theta^{(4)} = \begin{pmatrix} \theta_{1,1}^{(4)} & \cdots & \theta_{1,b}^{(4)} \\ \vdots & \ddots & \vdots \\ \theta_{a,1}^{(4)} & \cdots & \theta_{a,b}^{(4)} \end{pmatrix} = \{\theta_{i,j}^{(4)}\} \qquad (8)$$

In some embodiments, different candidate sub-matrices may have the same count of cycles of a preset length, and different candidate sub-matrices may also have different count of cycles of a preset length.

In the process of obtaining the counts of cycles of candidate sub-matrices based on the preset lengths, different preset lengths may be considered as much as possible to obtain their corresponding counts of cycles.

In step 230, the first sub-matrix $\tilde{B}_{a \times b}$ of the base matrix of the PBRL LDPC code may be determined based on the counts of cycles.

In some embodiments, the step 230 may be performed by a determination module 830.

In some embodiments, the determination module 830 may select a candidate sub-matrix corresponding to a minimum count of cycles of at least one preset length as the first sub-matrix $\tilde{B}_{a \times b}$ of the base matrix of the PBRL LDPC code. Specifically, the determination module 830 may initialize l to be 2 and obtain the corresponding preset length 2l=4. In the case of a preset length of 4, the count of cycles of the preset length may be obtained for each candidate sub-matrix according to step 220. If a candidate sub-matrix has a minimum count of cycles, the determination module 830 may select this candidate sub-matrix as the first sub-matrix $\tilde{B}_{a \times b}$ of the base matrix of the PBRL LDPC code.

For example, let there be 5 candidate sub-matrices, and the preset length is 4. The count of cycles of a preset length of 4 of each candidate sub-matrix are 2, 3, 3, 4 and 5 respectively as obtained according to step 220. It is then concluded that the count of 2 is the minimum count of cycles among the five counts, therefore the determination module 830 may select the candidate sub-matrix having a count of cycles of 2 as the first sub-matrix $\tilde{B}_{a \times b}$ of the base matrix of the PBRL LDPC code.

In some embodiments, if more than one candidate sub-matrices have the same minimum count of cycles of a preset length (e.g. for 5 candidate sub-matrices, the counts of cycles of a preset length are 2, 2, 2, 3, and 4, wherein 3 candidate sub-matrices have the same minimum count of 2), the determination module 830 may adjust the preset length and recalculate the counts of cycles, then select the first sub-matrix $\tilde{B}_{a \times b}$ of the base matrix of the PBRL LDPC code based on recalculated counts of cycles and a selection rule.

In some embodiments, the selection rule may be a rule of selecting the first sub-matrix $\tilde{B}_{a \times b}$ of the base matrix of the PBRL LDPC code based on whether there is a single minimum count of cycles of an adjusted preset length. The selection rule may include the following: if there is a single minimum count of cycles of a preset length, the determination module 830 may select the corresponding candidate sub-matrix as the first sub-matrix $\tilde{B}_{a \times b}$ of the base matrix of the PBRL LDPC code; if there are more than one minimum counts of cycles of a preset length, the determination module 830 may adjust the preset length such that there is a single minimum count of cycles of the adjusted preset length, and select the corresponding candidate sub-matrix as the first sub-matrix $\tilde{B}_{a \times b}$; if there are more than one minimum counts of cycles of an adjusted preset length after multiple length adjustments, the determination module 830 may either arbitrarily select one candidate sub-matrix from the candidate sub-matrices corresponding to the minimum count of cycles as the first sub-matrix $\tilde{B}_{a \times b}$ of the base matrix of the PBRL LDPC code, or select each of the candidate sub-matrix corresponding of to the minimum count of cycles as the first sub-matrix $\tilde{B}_{a \times b}$ of the base matrix of the PBRL LDPC code and perform later steps on all selected sub-matrices. The count of the length adjustments may be set based on the count of cycles or based on the experience of the operator.

In some embodiments, the method for adjusting the length of the cycle may include the following: adjusting the length of the cycle by increasing the length of the cycle (i.e., l=l+1) when more than one minimum counts of cycles exist. Specifically, when l=2, the length of the cycle is 4. If more than one minimum counts of cycles exist when the length is 4, adjust l to be l=2+1=3 and therefore the length of the cycle becomes 6. If more than one minimum counts of cycles still exist when the length is 6, further adjust l to be l=3+1=4 and therefore the length of the cycle becomes 8. If more than one minimum counts of cycles yet still exist when the length is 8, the adjustment may end.

Based on the count of cycles, the candidate sub-matrix having the minimum count of cycles of a short length may be selected as the first sub-matrix $\tilde{B}_{a \times b}$ of the base matrix of the PBRL LDPC code, because the less count of cycles of short lengths, the better performance the LDPC code has.

In step 240, an optimized first sub-matrix $B_1$ may be obtain by masking the first sub-matrix $\tilde{B}_{a \times b}$ based on the degree distributions of the PBRL LDPC code. The step 240 is optional.

In some embodiments, the step 240 may be performed by the determination module 830.

The masking may be a process of recalculating the value of each element in the first sub-matrix $\tilde{B}_{a \times b}$. Masking the first sub-matrix $\tilde{B}_{a \times b}$ may reduce the density of the check matrix, or satisfy requirements related to code length and code rate. For example, the masking process may set the values of k elements in the first sub-matrix $\tilde{B}_{a \times b}$ to −1, which consequently set the corresponding k CPMs of the first sub-matrix $\tilde{B}_{a \times b}$ to be all zero matrices to reduce the density of the masked first sub-matrix $\hat{B}_{a \times b}$. The degree distributions of the masked first sub-matrix $\hat{B}_{a \times b}$ may be derived based on the degree distributions of the first sub-matrix $\tilde{B}_{a \times b}$ without destroying the integrity of the first sub-matrix $\tilde{B}_{a \times b}$.

The optimized first sub-matrix $\hat{B}_{a \times b}$ refers to the first sub-matrix $\tilde{B}_{a \times b}$ after the masking process. The performance of the optimized first sub-matrix $\hat{B}_{a \times b}$ may be better than the first sub-matrix $\tilde{B}_{a \times b}$ before the masking process.

The degree distributions of the LDPC code refer to distribution functions of node degrees of nodes (i.e., variable nodes and check nodes) in the corresponding Tanner graph. The node degree refers to the count of edges connected to a node, a variable node degree refers to the count of edges connected to a variable node, and a check node degree refers to the count of edges connected to a check node. Detailed description of nodes and edges may be found in step 220.

The distribution function of a variable node may be expressed as the following formula:

$$v(r, x) = \sum_{i=1}^{n_v} v_i r^{b_i} x^{d_i} \qquad (9)$$

The distribution function of a check node may be expressed as the following formula:

$$\mu(x) = \sum_{i=1}^{n_c} \mu_i x^{q_i} \qquad (10)$$

In some embodiments, the degree distributions may be determined by a Differential Evolution algorithm. Detailed description of determining the degree distributions using the Differential Evolution algorithm may be found in FIG. 7.

In some embodiments, the determination module 830 may obtain the first sub-matrix $B_1$ of the base matrix of the PBRL LDPC code by masking the first sub-matrix $\tilde{B}_{a \times b}$ using a masking algorithm based on the degree distributions of the PBRL LDPC code, and then designating the optimized first sub-matrix $\hat{B}_{a \times b}$ as the first sub-matrix $B_1$. Detailed description of the masking algorithm may be found in FIG. 7.

The masking algorithm is an algorithm that performs masking based on the degree distributions and the counts of cycles. The inputs of the masking algorithm may include the first sub-matrix $\tilde{B}_{a \times b}$, the CPMs of size $q \times q$, and the degree distribution functions (i.e., $v(r, x)$, $\mu(x)$). The outputs of the masking algorithm may include the optimized first sub-matrix $\hat{B}_{a \times b}$.

The masking algorithm may output the optimized first sub-matrix $\hat{B}_{a \times b}$ by calculating the non-zero elements that satisfy certain requirements related to the count of cycles and the Extrinsic Message Degree (EMD) in the first sub-matrix $\tilde{B}_{a \times b}$, setting these non-zero elements to −1 to form a new matrix, and outputting the new matrix that satisfies the degree distribution functions.

The following may be the specific steps of the masking algorithm:

1: START
2: Set $\Omega = \emptyset$;
3: Set $l = 2$;
4: repeat
5: Calculate the count of cycles $\theta_{i,j}^{(2l)}$ for $i = 1, 2, \ldots,$ a and j=1, 2, ..., b;
6: Select $W_{i,j} \notin \Omega$ corresponding to the largest $\theta_{i,j}^{(2l)}$;
7: if the largest $\theta_{i,j}^{(2l)} = 0$ then
8: Set $l = l + 1$ and go to Step 5;
9: else if there are more than one such $w_{i,j}$'s then
10: Calculate all counts of cycles of length-2l corresponding to these $w_{i,j}$'s, denoted by $\epsilon_{i,j}^{(2l,\varphi)}$;
11: Set EMD threshold $T = \max_{i,j} \epsilon_{i,j}^{(2l,\varphi)} \varphi$;
12: Set $T = T - 1$;
13: For $T \neq 0$, select $w_{i,j}$ corresponding to the largest $\sum_{\varphi=0}^{T} \epsilon_{i,j}^{(2l,\varphi)}$;

for $T = 0$, mark as rebuild and go to Step 12;
14: if there are more than one such $w_{i,j}$'s then
15: Delete all $w_{i,j}$'s not corresponding to the largest $\sum_{\varphi=0}^{T} \epsilon_{i,j}^{(2l,\varphi)}$;
16: Go to Step 12; // if a single $w_{i,j}$ cannot be selected when $T = 0$, regenerate all $\theta_{i,j}^{(2l)}$ and repeat the above steps until a single $w_{i,j}$ can be selected.
17: end if
18: end if
19: Set the selected $w_{i,j}$ to −1;

20: for $w_{i,j}$ that would disrupt the preset degree distributions if set to −1, set $\Omega = \Omega \cup \{w_{i,j}\}$
21: until the updated first sub-matrix $\bar{B}_{a \times b}$ satisfies the preset degree distributions (for the updated first sub-matrix $\bar{B}_{a \times b}$ dose not satisfy the preset degree distributions, if mark as rebuild, go to Step 12; if does not mark as rebuild, go to Step 10).
22: Set $\hat{B}_{a \times b} = \bar{B}_{a \times b}$;
23: END.

$\hat{B}_{a \times b} = \{w_{i,j}\}$ denotes the first sub-matrix, q denotes the size of the CPMs, $v(r, x)$ and $\mu(x)$ denote the degree distributions, $\hat{B}_{a \times b}$ denotes the masked first sub-matrix $\tilde{B}_{a \times b}$, $\Omega$ denotes a matrix containing all the elements $w_{i,j}$ that would disrupt the preset degree distributions if set to −1, and $\varphi$ denotes the EMD.

For a person having ordinary skill in the art, modifications and variations may be made to the above steps under the guidance of the present specification. For example, the steps may be combined or split (e.g., step 1 and step 2 may be combined into one step).

Masking the first sub-matrix $\tilde{B}_{a \times b}$ to obtain the optimized first sub-matrix $\hat{B}_{a \times b}$ may eliminate the largest count of short cycles and cycles with a smaller EMD in the first sub-matrix $\tilde{B}_{a \times b}$, and hence the error performance of the LDPC code may be enhanced.

It should be noted that the above description of the process 200 is intended to be illustrative and not limiting the scope of this specification. Modifications and variations may be made to the process 200 under the guidance of the present specification. However, these modifications and variations are still within the scope of this specification.

Figure 3:
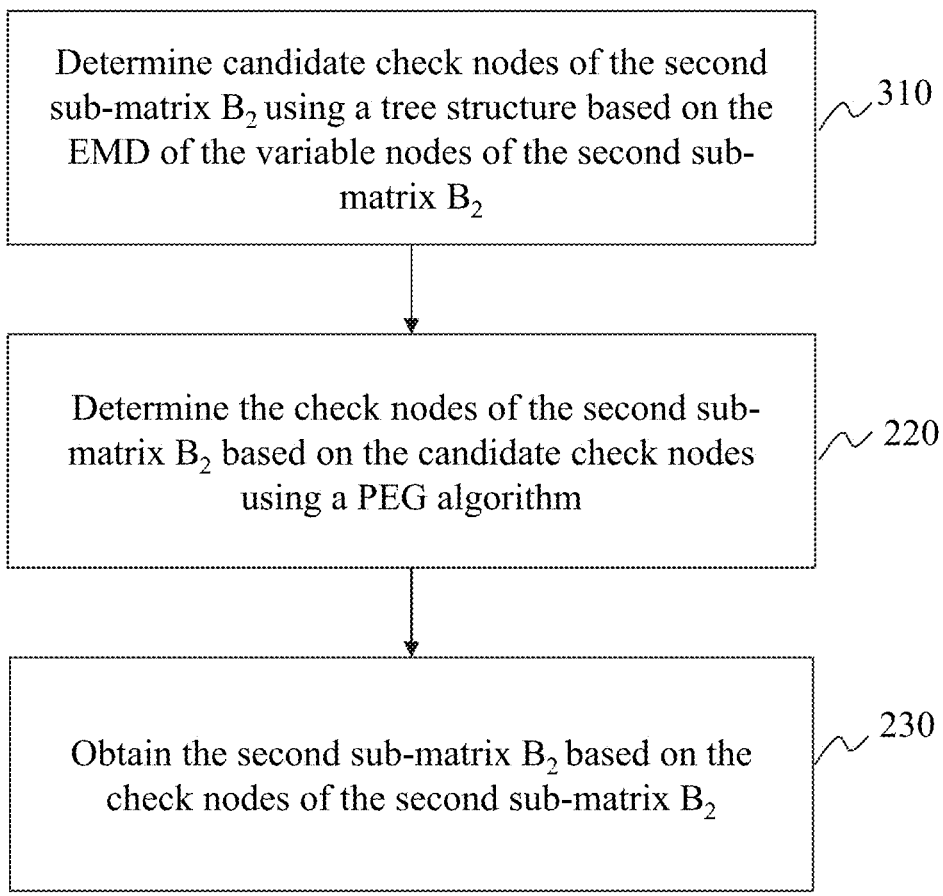
FIG. 3 is a flowchart illustrating an exemplary process for constructing a second sub-matrix according to some embodiments of the present disclosure.

FIG. 3 is a flowchart illustrating an exemplary process for constructing a second sub-matrix according to some embodiments of the present disclosure.

In some embodiments, the determination module 830 may construct the second sub-matrix $B_2$ of the PBRL LDPC code based on the optimized first sub-matrix $B_1$.

The second sub-matrix represents the base matrix of the second check sub-matrix $H_2$ in the check matrix $H_{PBRL\ LDPC}$ of the PBRL LDPC code, denoted by $B_2$. Let the second check sub-matrix $H_2$ consists of $q \times q$ CPMs, and the size of the second sub-matrix $B_2$ is $f \times b$, wherein the count of the rows is larger than the count of columns of the second sub-matrix $B_2$, i.e., $f > b$.

In some embodiments, the process 300 may include the following steps.

In step 310, candidate check nodes of the second sub-matrix $B_2$ may be determined using a tree structure based on the EMD of the variable nodes of the second sub-matrix $B_2$. In some embodiments, the step 310 may be performed by the determination module 830.

The EMD of the variable nodes refers to the count of the check nodes singly connected to the variable nodes.

Figure 11:
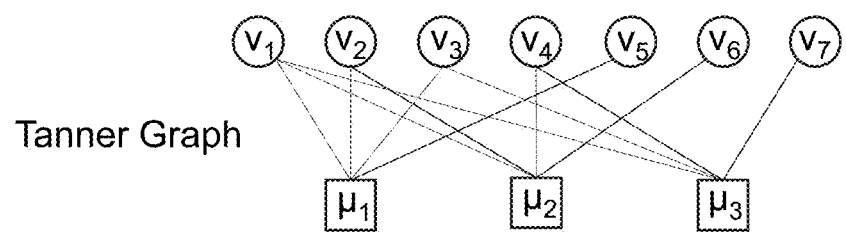
FIG. 11 is an exemplary graph of a tree structure according to some embodiments of the present disclosure.
Figure 11:
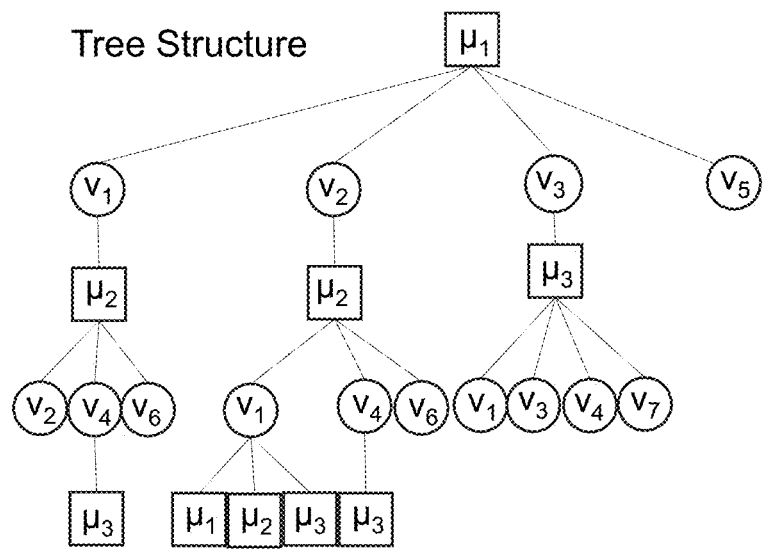

The tree structure refers to the Tanner graph corresponding to a LDPC code in the form of a tree diagram. Specifically, the tree structure originates from a root node and expands, wherein the root node corresponds to a check node of the LDPC code. FIG. 11 is an exemplary graph of the tree structure according to some embodiments of the present disclosure. As shown in FIG. 11, the tree structure originates from a root node corresponding to the check node $\mu_1$ in the check matrix $H_z$, and expands to the variable nodes that are connected to the check node by edges (i.e., $v_1$, $v_2$, $v_3$ and $v_5$). The tree structure then originates from these variable nodes, and further expands to the check nodes that are connected to these variable nodes by edges. The tree structure keeps expanding until no more connected node can be expanded to in every branch. After the expansion is finished, the nodes at the tip of the tree structure are check nodes.

In some embodiments, the determination module 830 may determine the candidate check nodes of the second sub-matrix $B_2$ using the tree structure based on the EMD of the variable nodes of the second sub-matrix $B_2$. Specifically, the determination module 830 may determine the candidate check nodes of the second sub-matrix $B_2$ by the following steps:

(1) Determining a set A of the check nodes farthest from the selected root node in the tree structure, wherein $$A = \left\{ \overline{N_{v_j}^{l-1}} : \overline{N_{v_j}^{l}} = \emptyset \right\},$$

the check node $v_j$ denotes the selected root node, $$N_{v_i}^{l}$$

denotes a set of the check nodes that may expend to depth l in the tree structure, and $$\overline{N_{v_j}^{l}}$$

denotes the complement of set $$\overline{N_{v_j}^{l}}.$$

It can be established that $$N_{v_j}^{l} = V_C / \overline{N_{v_j}^{l}},$$

wherein $v_c$ denotes a set of all the check nodes, $$\overline{N_{v_j}^{l-1}}$$

denotes the complement of the set containing all the check nodes expanded to within the depth l−1 in the tree structure with the check node $v_j$ as the root node;

(2) Selecting the check nodes with the smallest EMD from the set A to form a set B, wherein $$B = \left\{ c_i : |M|_{c_i}^0 = \min_{c_r \in A} |M|_{r_x}^0 \right\},$$

$c_i$ denotes the check nodes, and $$M_{c_i}^{l}$$

denotes a set of the variable nodes that can be expanded to within the depth l in the tree structure with the check node $c_i$ as the root node;

(3) Selecting the check nodes from the set B that have the fewest paths to expand to as root nodes to form a set C;

(4) Selecting the check nodes with the largest EMD from the set C as the candidate check nodes.

The above steps may by represented by the following algorithm:

1:     if k = 1 then
    connect a variable node $v_j$ to a check nodes $c_i$ selected randomly from the set $\left\{ c_i : |M|_{c_i}^0 = \min_{c_x \in A} |M|_{c_x}^0 \right\}$ with an edge 2:     else
3:     expand the tree structure from the root node $v_j$ to depth such that either $\overline{N_{v_i}^{l-1}} = \overline{N_{v_j}^{l}} \neq \emptyset$ or $\overline{N_{v_j}^{l}} = \emptyset$ 4:     $A = \left\{ \overline{N_{v_j}^{l-1}} : \overline{N_{v_j}^{l}} = \emptyset \right\}$ 5:     $B = \left\{ c_i : |M|_{c_i}^0 = \min_{c_x \in A} |M|_{c_x}^0 \right\}$ 6:     for each check node $c_i$ in B, find the paths of $v_j$ by the following steps:

7:     find all the nodes at each level $D_a = M_{v_j}^a \cap M_{c_i}^{L-a}$

8:     initialize the set of the paths $s_q = \{v_j, v_{u_q}\}$, $q \in 1, \ldots, D_1$, and expend to the level L according to the function $$s_x = s_v \cup v_{w_y} : N_{s_v \cap D_a}^a \cap N_{v_{w_y}}^a, \forall s_v, v \in \{1, \ldots, P_a\}, \forall v_{w_y} \in D_{a+1};$$

9:     prune the set B based on the count of paths and obtain the set $$C = \left\{ c_i : P_{c_i} = \min_{c_y \in B} P_{c_y} \right\}$$

10:     calculate the paths of the EMD corresponding to each check node $c_i$ according to the function $$E_{p, c_i} = \left\{ |c_k| : c_k \in N_{s(b)_{p, c_i}}^U, c_k \notin N_{s(d \neq b)_{p, c_i}}^U, \forall b, d \in \{1, \ldots, l\} \right\}$$

11:     calculate the mean path EMD corresponding to each path of the EMD of the check node $c_i$ according to the function $\gamma_{c_i} = \frac{1}{P_{c_i}} \sum_p E_{p, c_i}$ 12:     select the check nodes with the best connectivity according to the function $c_{place} = c_i \in C : \gamma_{c_i} = \max_{c_z \in C} \gamma_{c_z}$ end if Since larger EMD corresponds to better connectivity, the check node $c_i$ with the largest average EMD $\gamma_{c_i}$ may be selected as the candidate check node.

The length of the cycle in a Tanner graph corresponding to a check matrix H is an important factor affecting the performance of the LDPC code. The shorter the length of the cycle is, the worse performance the corresponding LDPC code has. Since all the paths of cycles and their corresponding lengths of the LDPC code may be obtained using the tree structure, the check nodes corresponding the largest EMDs, i.e., the largest lengths of cycles, may be selected as the candidate check nodes to achieve better performance of the LDPC code.

In step 320, the check nodes of the second sub-matrix $B_2$ may be determined based on the candidate check nodes using a PEG algorithm. In some embodiments, the step 320 may be performed by the determination module 830.

The PEG (Progressive Edge-Growth) algorithm refers to an algorithm that constructs the check matrix H by adding the edges individually under given degree distributions. Specifically, edges which maximum the length of cycles are used to construct the check matrix H. By using the PEG algorithm, the check matrix H of the LDPC code may be constructed to satisfy the preset degree distributions. Detailed description of the degree distributions may be found in step 240.

In some embodiments, the determination module 830 may determine the check nodes of the second sub-matrix $B_2$ based on the candidate check nodes using the PEG algorithm. Specifically, the check nodes of the second sub-matrix $B_2$ may be determined by the following algorithm:

---

1:   for k = 0 to t-1 do
2:   for j = 0 to $d_v$ − 1 do
3:   obtain the check nodes $c_i$ connected to $v_j$ using the algorithm provided in step 310

4:   $(c_i, v_{k \times cpm}) \to E^j_{v_{k \times cpm}}$

5:   for i = 1 to n − 1 do

6:   $(c_{(i/cpm) \times cpm + mod(i+1, cpm)}, v_{kn+l}) \to E^j_{v_{k \times cpm+l}}$, wherein $E_{v_{k \times cpm+l}}^j$ denotes the j-th edge of $v_{k \times cpm+l}$, and $c_{(i/cpm) \times cpm+mod(i+l,cpm)}$ denotes the place of $c_i$ after circulating l times
7:   end for
8:   if the node does not satisfy the degree distributions $d_c$ then 9:   delete $E^j_{v_{k \times cpm+l}}, \ldots, E^j_{v_{(k+1) \times cpm-1}}$, return to step 3 and reselect another check nodes $c_i$
10:   end if
11:   end for
12:   end for

---

Using the above algorithm, the determination module 830 may determine whether a candidate check node satisfies the preset degree distributions, delete the candidate check nodes that do not satisfy the preset degree distributions, and retain the candidate check nodes that satisfy the preset degree distributions. The determination module 830 may select the candidate check nodes that satisfy the preset degree distributions as the check nodes of the second sub-matrix $B_2$. For example, let there be 3 candidate check nodes $c_1$, $c_2$ and $c_3$, the determination module 830 may individually determine whether each of the 3 candidate check nodes satisfies the preset degree distributions using the above algorithm. The determination module 830 may first determine if $c_1$ satisfies the preset degree distributions, and delete $c_1$ if $c_1$ does not satisfy the preset degree distributions. The determination module 830 may then determine if $c_2$ satisfies the preset degree distributions, and retain $c_2$ if $c_2$ satisfies the preset degree distribution. The determination module 830 may lastly determine if $c_3$ satisfies the preset degree distributions, and retain $c_3$ if $c_3$ satisfies the preset degree distribution. As a result, the determination module 830 may select $c_2$ and $c_3$ as the check nodes for the second sub-matrix $B_2$.

Using the above algorithm, the check nodes satisfying the preset degree distributions may be selected from the candidate check nodes such that the check matrix $H_2$ corresponding to the second sub-matrix $B_2$ satisfies the preset degree distributions.

In step 330, the second sub-matrix $B_2$ may be obtained based on the check nodes of the second sub-matrix $B_2$. In some embodiments, the step 330 may be performed by the determination module 830.

In some embodiments, the determination module 830 may obtain the second sub-matrix $B_2$ based on the check nodes of the second sub-matrix $B_2$. Specifically, based on the tree structure, the determination module 830 may obtain the second sub-matrix $B_2$ by: selecting the variable nodes connected to the check nodes of the second sub-matrix $B_2$ as the variable nodes of the second sub-matrix $B_2$; setting the variable nodes as the rows of the second sub-matrix $B_2$; and setting the check nodes as the columns of the second sub-matrix $B_2$.

Obtaining the check nodes and the corresponding variable nodes of the second sub-matrix $B_2$ using the tree structure and the PEG algorithm related to the EMD may result in better performance of the LDPC code.

It should be noted that the above description of the process 300 is intended to be illustrative and not limiting the scope of this specification. Modifications and variations may be made to the process 300 under the guidance of the present specification. However, these modifications and variations are still within the scope of this specification.

FIG. 4 is a flowchart illustrating an exemplary process for permuting the first sub-matrix and the second sub-matrix based on a column permutation matrix according to some embodiments of the present disclosure. In some embodiments, the process 400 may include the following steps.

In step 410, the column permutation matrix may be obtained based on a permutation rule. In some embodiments, the step 410 may be performed by the determination module 830.

In some embodiments, the permutation rule may include any rule for performing permutation operations. For example, the permutation rule may include permuting a column to another column in the matrix. For another example, the permutation rule may include adding a column to another column in the matrix. For yet another example, the permutation rule may include multiplying a column in the matrix by a multiplier.

In some embodiments, the column permutation matrix refers to a matrix for performing matrix permutation. In some embodiments, the column permutation matrix may be obtained through any combination of one or more identity matrices.

In some embodiments, the determination module 830 may obtain the column permutation matrix based on the permutation rule. Detailed description of obtaining the column permutation matrix based on the permutation rule may be found in FIG. 5.

In step 420, the base matrix of the PBRL LDPC code may be obtained by permuting the first sub-matrix and the second sub-matrix based on the column permutation matrix. In some embodiments, the step 420 may be performed by the determination module 830.

In some embodiments, the determination module 830 may obtain the base matrix of the PBRL LDPC code by permuting the first sub-matrix and the second sub-matrix based on the column permutation matrix. For example, the determination module 830 may obtain the base matrix of the PBRL LDPC code by permuting the determined punctured columns, filler columns and full-rank columns such that these columns are in the last columns in the first sub-matrix $B_1$ and the second sub-matrix $B_2$.

Based on the column permutation matrix, the locations of the punctured columns, the filler columns and the full-rank columns may be fixed after permuting the first sub-matrix $B_1$ and the second sub-matrix $B_2$ in order to conform to the 5G protocol standard and to easily perform relevant simulations.

It should be noted that the above description of the process 400 is intended to be illustrative and not limiting the scope of this specification. Modifications and variations may be made to the process 400 under the guidance of the present specification. However, these modifications and variations are still within the scope of this specification.

Figure 5:
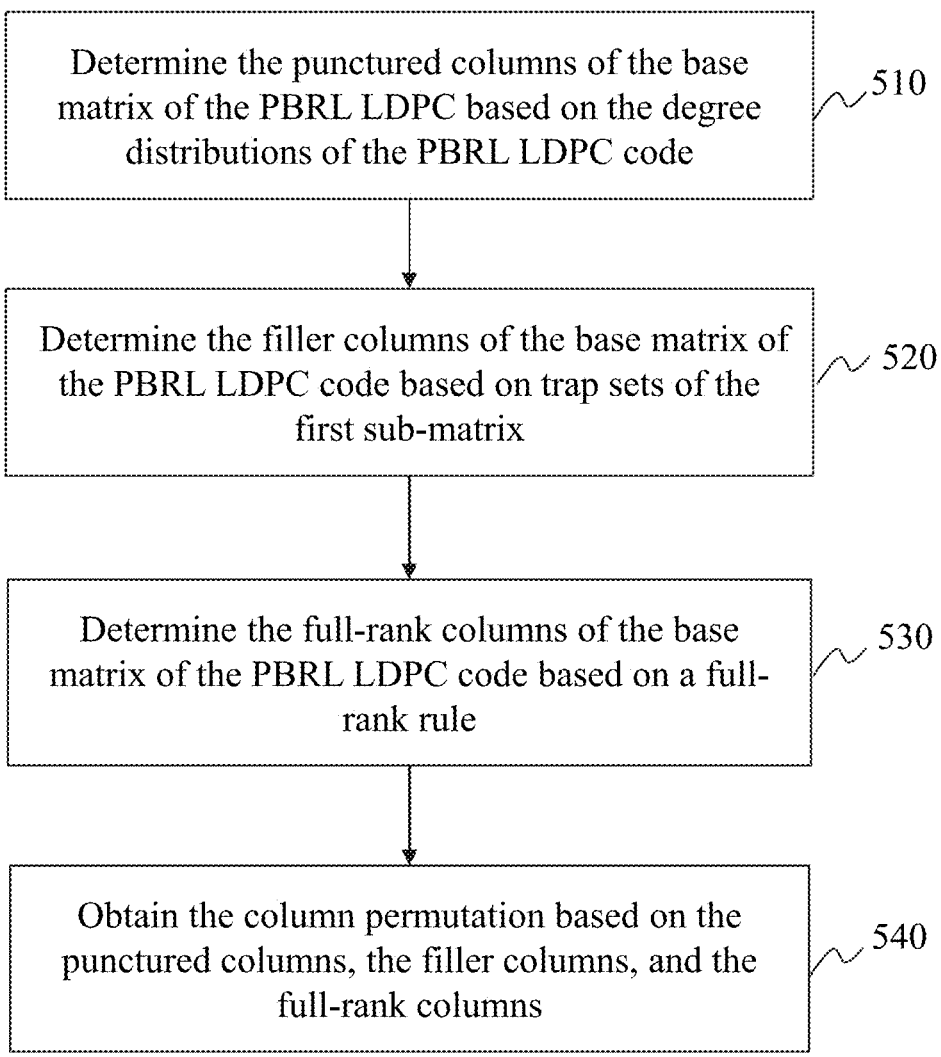
FIG. 5 is a flowchart illustrating an exemplary process for constructing the column permutation matrix according to some embodiments of the present disclosure.
Figure 6:
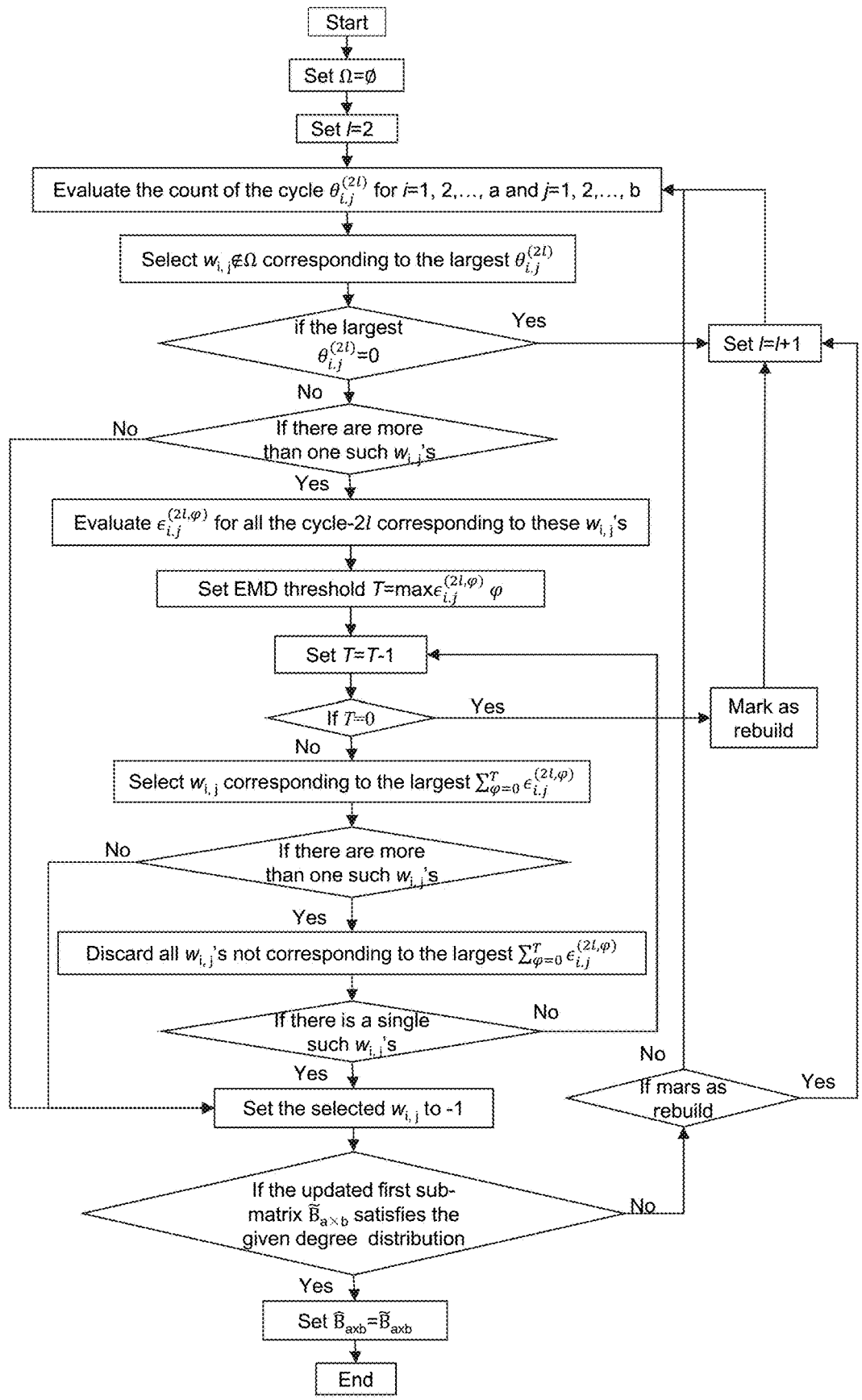
FIG. 6 is a flowchart illustrating an exemplary process for masking according to some embodiments of the present disclosure.

FIG. 5 is a flowchart illustrating an exemplary process for constructing the column permutation matrix according to some embodiments of the present disclosure. In some embodiments, the process 500 may include the following steps.

In step 510, the punctured columns of the base matrix of the PBRL LDPC code may be determined based on the degree distributions of the PBRL LDPC code. In some embodiments, the step 510 may be performed by the determination module 830.

The punctured columns refer to redundant columns that need to be punctured in a check matrix H.

In some embodiments, the determination module 830 may select the punctured columns randomly. In some embodiments, the determination module 830 may select the punctured columns periodically.

In some embodiments, the punctured columns may be determined based on the degree distribution functions. As an example, a degree distribution function of variable nodes may be as follows:

$$v(r, x) = 0.04 r_0 x_1^3 x_2^{17} + 0.12 r_1 x_1^3 x_2^8 + 0.12 r_1 x_1^2 x_2^5 + 0.76 r_1 x_3 \quad (11)$$

wherein $r_0$ indicates that these variable nodes are punctured, the term $$x_1^3 x_2^{17}$$

indicates that the nodes correspond to columns with a weight of 3 in $B_1$ and a weight of 17 in $B_2$, 0.04 is the ratio between the count of nodes with such a degree distribution to the total of unpunctured variable nodes of the whole code, $r_1$ indicates that the nodes are unpunctured nodes, and $x_3$ indicates that the nodes correspond to columns with a weight of 1 in the identity matrix I. The remaining terms $$0.12 r_1 x_1^3 x_2^8 \text{ and } 0.12 r_1 x_1^2 x_2^5$$

may be explained similarly as above. As another example, a degree distribution function of check nodes may be as follows:

$$\mu(x) = 0.08 x_1^9 + 0.04 x_2^2 x_3 + 0.72 x_2^3 x_3 \quad (12)$$

wherein the term $0.72 x_2^3 x_3$ indicates that the nodes correspond to rows with a weight of 3 in $B_2$ and a weight of 1 in the identity matrix I, 0.72 is the ratio between the count of check nodes with such a degree distribution to the total of unpunctured variable nodes of the whole code.

In step 520, the filler columns of the base matrix of the PBRL LDPC code may be determined based on trap sets of the first sub-matrix. In some embodiments, the step 520 may be performed by the determination module 830.

The trap sets may include problematic graphical structures that dominate the error floor performance in the PBRL LDPC code. Detailed description of the trap sets may be found in Q. Huang, Q. Diao, S. Lin and K. Abdel-Ghaffar, "Trapping sets of structured LDPC codes," 2011 IEEE International Symposium on Information Theory Proceedings, 2011, pp. 1086-1090, Doi: 10.1109/ISIT.2011.6033698. The trap sets may consist of short cycles and their adjacent paths. The trap set may be the set of the variable nodes that cannot be successfully decoded in the Tanner graph after multiple iterations of decoding by the LDPC code. In general, smaller trap sets correspond to greater harm and more significant error floor.

In some embodiments, the determination module 830 may obtain the trap sets by exhaustive searching. Specifically, the determination module 830 may search for a variable node with small degree from the Tanner graph and use it as the basis, then search the trap sets of the LDPC code by expanding the paths. In some embodiments, the determination module 830 may obtain the trap sets by random sampling.

The filler columns refer to columns that need to be filled in the check matrix H. A filler column corresponds to an element in the codeword and is usually set as 0 based on matrix multiplication. The variable nodes represented by the non-filler columns may form the LDPC code with a larger girth by setting the filler column. The girth refers to the length of the shortest cycle in the check matrix H. The filler columns may be used to reduce harmful trap sets and improve the performance of the LDPC code.

In some embodiments, the determination module 830 may search for and calculate a portion or all trap sets in the first sub-matrix $B_1$, and select the columns that eliminate the most trap sets as the filler columns of the base matrix of the PBRL LDPC code. Specifically, the determination module 830 may consider all the combination of the filler columns, look for a combination that eliminates the most trap sets (a, 0) and set that combination as the filler columns, wherein a denotes the count of variable nodes, and 0 denotes the count of check nodes with odd degrees.

According to the above steps for determining the fill columns, the trap sets in the base matrix may be significantly reduced, and the reduction of the trap sets may reduce the error floor effectively, therefore reducing the error rate of the obtained PBRL LDPC code.

In step 530, the full-rank columns of the base matrix of the PBRL LDPC code may be determined based on a full-rank rule. In some embodiments, the step 530 may be performed by the determination module 830.

The full-rank columns refer to the vectors in a maximal linearly independent group constructed by the vectors of the columns of the check matrix H. In some embodiments, one or more maximal linearly independent groups may be constructed based on the check matrix H, and the full-rank columns may be any of the vectors in the maximal linearly independent groups.

In some embodiments, after the punctured columns and the filler columns are determined, the determination module 830 may select the full-rank columns out of the remaining columns. For example, for a first sub-matrix $B_1$ of size a×b, after the punctured columns and the filler columns of $B_1$ are determined, the determination module 830 may select d columns out of the remaining columns of $B_1$ and set the d columns to be the full-rank columns of the base matrix of the PBRL LDPC code, wherein the selected d columns may form a full-rank matrix of size a×d with the a rows of $B_1$.

In the process of obtaining the full-rank columns based on the full-rank rule, the Gaussian elimination algorithm may be used directly on the check matrix H during the encoding process of the LDPC code to systematically generate the codes.

In step 540, the column permutation matrix may be obtained based on the punctured columns, the filler columns, and the full-rank columns. In some embodiments, the step 540 may be performed by the determination module 830.

In some embodiments, the determination module 830 may obtain the column permutation matrix based on the locations of the punctured columns, the filler columns, and the full-rank columns before and after the permutation.

The column permutation matrix may fix the locations of the punctured columns, the filler columns, and the full-rank columns to conform to the 5G protocol standard, and hence relevant simulations may be easily performed.

It should be noted that the above description of the process 500 is intended to be illustrative and not limiting the scope of this specification. Modifications and variations may be made to the process 500 under the guidance of the present specification. However, these modifications and variations are still within the scope of this specification.

Figure 7:
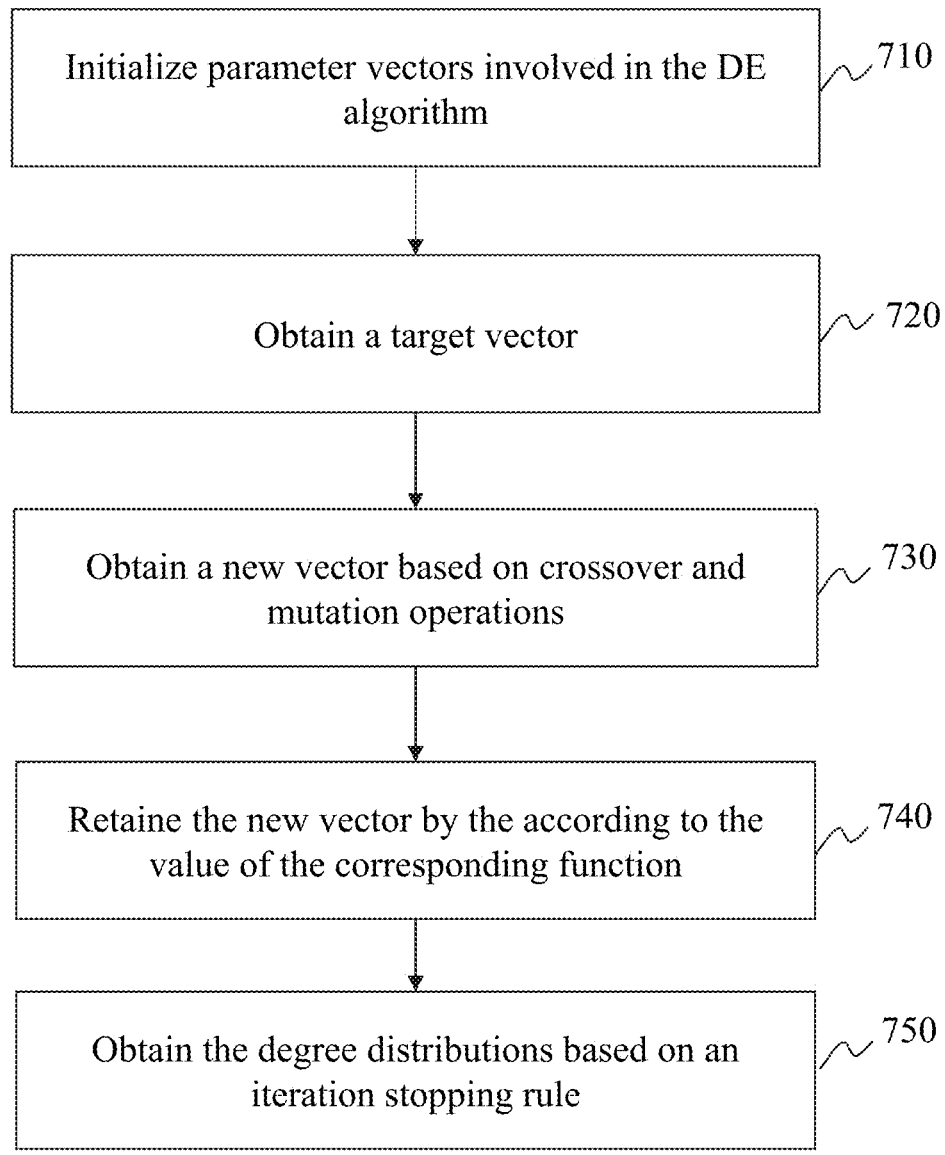
FIG. 7 is a flowchart illustrating an exemplary process for determining degree distributions based on a Differential Evolution algorithm according to some embodiments of the present disclosure.

FIG. 7 is a flowchart illustrating an exemplary process for determining the degree distributions based on the Differential Evolution algorithm according to some embodiments of the present disclosure.

A good pair of degree distributions may reduce the error floor and reduce the complexity of the encoding process and the decoding process. An important standard for evaluating the degree distributions is the size of the decoding threshold. For continuous spaces, the Differential Evolution algorithm (DE) may be used to search for a good pair of degree distributions. The DE algorithm is a population-based metaheuristic search algorithm that optimizes a problem by iteratively improving a candidate solution based on an evolution process.

In some embodiments, the degree distributions of the PBRL LDPC code may be determined using the DE algorithm. In some embodiments, the process 700 may include the following steps.

In step 710, parameter vectors involved in the DE algorithm may be initialized. In some embodiments, the step 710 may be performed by the determination module 830.

In some embodiments, the determination module 830 may initialize the parameter vectors involved in the DE algorithm. Specifically, the determination module 830 may: preset the parameter vectors $z=[z_1, z_2, \ldots, z_D]^T \in \Omega$, wherein $\Omega$ denotes the degree distributions; determine the count of variables involved in the DE algorithm of the degree distributions, denoted by D wherein $0 \leq D \leq N-1$; randomly generate N random vectors $z_{D2,g}$ of D dimensions, wherein g denotes the count of iterations; and set the threshold function $T(z)=\theta^*(v(r,x),\mu(x))$, wherein $\theta^*(v(r, x),\mu(x))$ denotes channel parameters.

In some embodiments, the determination module 830 may calculate the threshold of the PBRL LDPC code using the Density Evolution algorithm. The Density Evolution algorithm is a method for analyzing the asymptotic performance of network capability approaching error-correcting codes. The threshold refers to the maximum channel parameters of the PBRL LDPC code, wherein the channel parameters may be expressed as $\theta^*(v(r,x),\mu(x))$, and the threshold may be expressed as $\theta^*(v(r,x),\mu(x))=\max \theta$.

In step 720, a target vector may be obtained. In some embodiments, the step 720 may be performed by the determination module 830.

In some embodiments, the determination module 830 may obtain the target vector. Specifically, the determination module 830 may obtain the maximum threshold by calculating the threshold function T(z) and set the vector corresponding to the maximum threshold as the target vector $z^*$.

In step 730, a new vector may be obtained based on crossover and mutation operations. In some embodiments, the step 730 may be performed by the determination module 830.

In some embodiments, the determination module 830 may obtain the new vector based on crossover and mutation operations. Specifically, for an original vector z, the determination module 830 may randomly select two vectors (such as $z_{D1,g}$ and $z_{D2,g}$) among the remaining vectors, define F as the weight factor, and calculate the crossover vector using the following function:

$$z'_{D,g}=z_{D,g}+F(z_{D1,g}-z_{D2,g}) \tag{13}$$

According to the preset weight, the determination module 830 may obtain the new vector $z''_{D,g}$.

In step 740, the new vector may be retained according to the value of the corresponding function. In some embodiments, the step 740 may be performed by the determination module 830.

In some embodiments, the determination module 830 may decide whether to retain the new vector based on the value of the corresponding function. Specifically, the determination module 830 may retain the new vector if $T(z'_{D,g})>T(z_{D,g})$, and replace $z_{D,g+1}$ with $z''_{D,g}$ as the original vector in the next iteration. Otherwise, the determination module 830 may retain the original vector $z_{D,g}$ and use $z_{D,g+1}$ as the original vector in the next iteration.

In step 750, the degree distributions may be obtained based on an iteration stopping rule. In some embodiments, the step 750 may be performed by the determination module 830.

In some embodiments, the determination module 830 may obtain the degree distributions based on the iteration stopping rule.

In some embodiments, the iteration stopping rule may include the following: if the preset times of iteration (such as 20 times) is met, or the obtained target function value is greater than the parameter vector of the preset threshold (i.e., $T(z^*)>T(z)$), stop the iterations and obtain the degree distributions; otherwise, go to step 720 to iterate.

The determination module 830 may obtain degree distributions with a higher noise threshold by performing crossover, mutation, and iteration operations to the parameter vectors of the original degree distributions.

In some embodiments, the methods for obtaining the degree distributions may include estimating the performance of the degree distributions by constructing a certain matrix. In some embodiments, the methods for obtaining the degree distributions may include using the Discrete Density Evolution algorithm. In some embodiments, the methods for obtaining the degree distributions may further include other optimization algorithms not limited by the present embodiments.

It should be noted that the above description of the process 700 is intended to be illustrative and not limiting the scope of this specification. Modifications and variations may be made to the process 700 under the guidance of the present specification. However, these modifications and variations are still within the scope of this specification.

Figure 8:
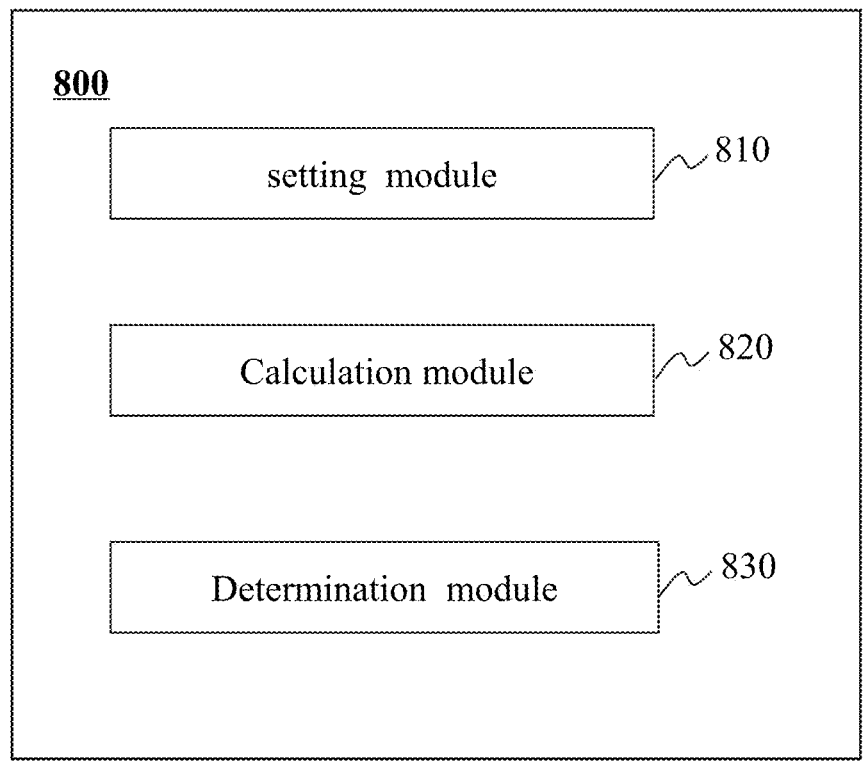
FIG. 8 is a block graph of a system for constructing a base matrix of the PBRL LDPC code according to some embodiments of the present disclosure.

FIG. 8 is a block graph of a system for constructing the base matrix of the PBRL LDPC code according to some embodiments of the present disclosure. As shown in FIG. 8, the system 800 may include the setting module 810, the calculation module 820, and the determination module 830.

In some embodiments, the setting module 810 may be configured to determine at least one candidate sub-matrix of the PBRL LDPC code based on the base matrix of the QR-QC-LDPC code.

In some embodiments, the calculation module 820 may be configured to obtain one or more counts of cycles of the preset length for the at least one candidate sub-matrix.

In some embodiments, the determination module 830 may be configured to determine the first sub-matrix of the base matrix of the PBRL LDPC code based on the counts of cycles.

In some embodiments, the determination module 830 may select the candidate sub-matrix corresponding to the minimum count of cycles of the preset length as the first sub-matrix.

In some embodiments, the determination module 830 may obtain the optimized first sub-matrix by masking the first sub-matrix based on the degree distributions of the PBRL LDPC code, wherein the degree distributions are determined by the Differential Evolution algorithm.

In some embodiments, the determination module 830 may construct the second sub-matrix of the PBRL LDPC code based on the optimized first sub-matrix, wherein the count of rows is larger than the count of columns of the second sub-matrix.

In some embodiments, the determination module 830 may determine the candidate check nodes of the second sub-matrix based on the extrinsic message degrees of variable nodes of the second sub-matrix using a tree structure; determine the check nodes of the second sub-matrix based on the candidate check nodes using the PEG algorithm; and obtain the second sub-matrix based on the check nodes of the second sub-matrix.

In some embodiments, the determination module 830 may obtain the column permutation matrix based on the permutation rule; and obtain the base matrix of the PBRL LDPC code by permuting the first sub-matrix and the second sub-matrix based on the column permutation matrix.

In some embodiments, the determination module 830 may determine the punctured columns of the base matrix of the PBRL LDPC code based on the degree distributions of the PBRL LDPC code; determine the filler columns of the base matrix of the PBRL LDPC code based on the trap sets of the first sub-matrix; determine the full-rank columns of the base matrix of the PBRL LDPC code based on the full-rank rule; and obtain the column permutation matrix based on the punctured columns, the filler columns, and the full-rank columns.

The processing devices and the modules shown in FIG. 8 may be implemented in a variety of ways. For example, in some embodiments, the devices and the modules may be implemented by hardware, software, and/or a combination of both. Specifically, the hardware may be implemented using dedicated logic, the software may be stored in the storage and be executed by the appropriate instruction execution system (e.g., a microprocessor or a dedicated design hardware). For those skilled in the art, the above processing devices and modules may be implemented by computer executable instructions. The system and the modules of the present specification may be implemented by hardware such as a very large-scale integrated circuit, a gate array, a semiconductor (e.g., a logic chip and/or a transistor), or a hardware circuit of a programmable device (e.g., a field programmable gate array and/or a programmable logic device). The system and the modules of the present specification may also be implemented by software executable by various types of processors, and/or by a combination of above-mentioned hardware and software (e.g., a firmware).

It should be noted that the above description of the system 800 and its modules is only intended to be illustrative and not limiting to the scope of the embodiments. A person having ordinary skill in the art, with understanding of the principles behind the system above and without deviating from these principles, may combine different parts of the system in any order and/or create a sub-system and connect it with other parts. For example, one device may have different modules for the setting module 810, the calculation module 820, and the determination module 830 in FIG. 8, or have one module that achieves two or more functions of these three modules. For another example, each module in the system 800 may share one storage module, or have an individual storage unit of its own. For yet another example, the setting module 810 may be a separate component without being a module inside the system 800. Such variations are all within the scope of this specification.

Figure 12A:
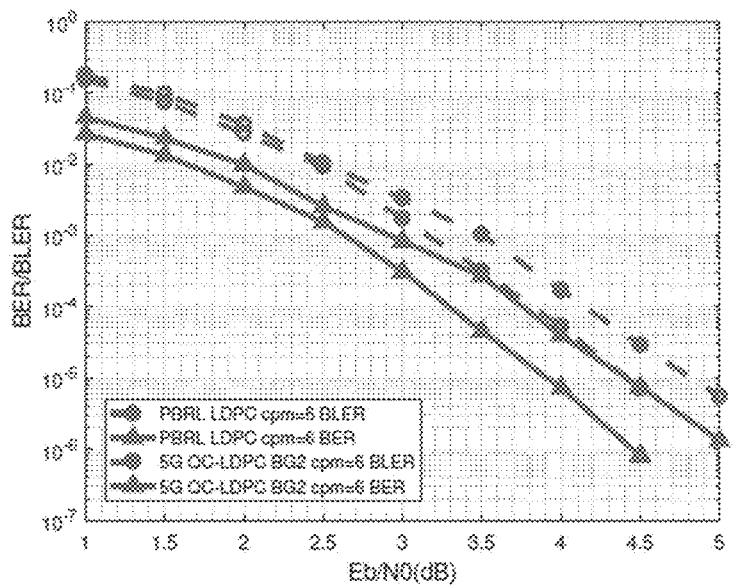
FIGS. 12A-C are exemplary graphs of simulation results according to some embodiments of the present disclosure.
Figure 12B:
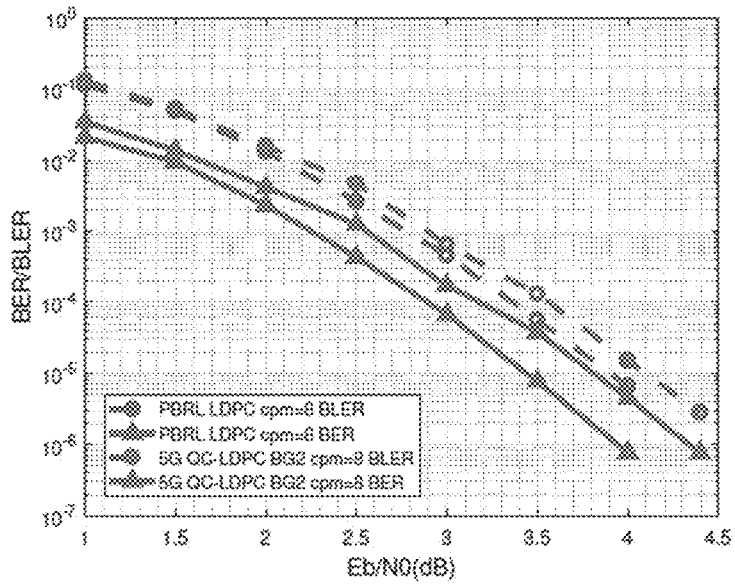
Figure 12C:
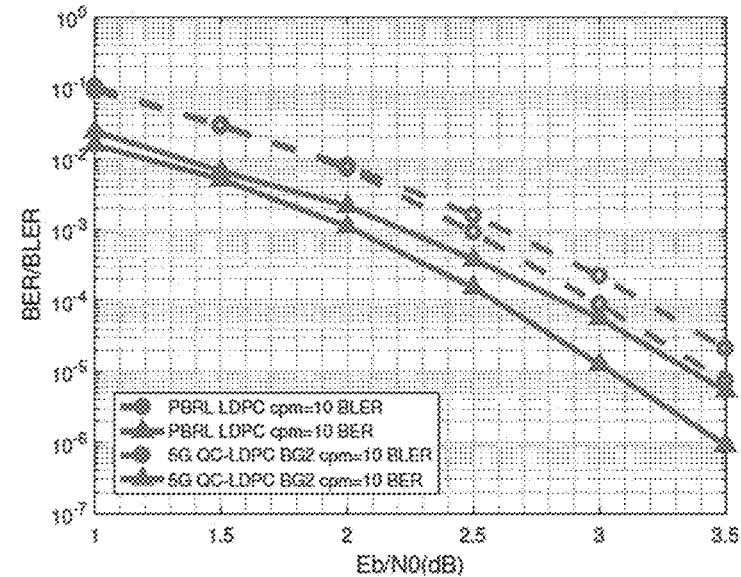

FIG. 12A-C are exemplary graphs of simulation results according to some embodiments of the present disclosure.

Assuming parameters a=4, b=14, f=18, and the degree distributions given in (11) and (12), $B_1$ with a size of 4×14 and $B_2$ with a size of 38×14 can be obtained. Letting n=17, it can be obtained that $Q_{17}$={1, 2, 4, 8, 9, 13, 15, 16} and $B_{QR}$ has a size of m×n=8×17. Moreover, besides the last a=4 columns in $B_1$ forming a full-rank matrix, the column permutation matrix σ also needs to satisfy the following two requirements:

1) Punctured columns are located at the first few columns, where in this case the first two columns.

2) Filler columns are located at columns 7, 8, 9 and 10.

Setting parameter q=6, 8 and 10, three PBRL LDPC codes can be constructed respectively based on proposed algorithms in this specification:

Code I constructed based on q=6:

Select 4 rows from $B_{QR}$ to form $\tilde{B}_{4\times14}$={$j_1$=1, $j_5$=9, $j_6$=13, $j_7$=15}

Select 14 columns from $B_{QR}$ to form $\tilde{B}_{4\times14}$={1, 3, 4, 5, 6, 7, 8, 9, 11, 12, 13, 14, 15, 16}

Obtain the masking matrix $$M_{q=6} = \begin{pmatrix} 11110111011000 \\ 01110001111011 \\ 11001110110101 \\ 10011010101111 \end{pmatrix}$$

Obtain the column permutation matrix $$\sigma_{q=6} = \begin{pmatrix} 1\ 2\ 3\ 4\ 5\ 6\ 7\ 8\ 9\ 10\ 11\ 12\ 13\ 14 \\ 1\ 2\ 7\ 9\ 13\ 14\ 3\ 4\ 10\ 12\ 5\ 6\ 8\ 11 \end{pmatrix}$$

2) Code II constructed based on q=8:

Select 4 rows from $B_{QR}$ to form $\tilde{B}_{4\times14}$={$j_2$=2, $j_5$=9, $j_6$=13, $j_8$=16}

Select 14 columns from $B_{QR}$ to form $\tilde{B}_{4\times14}$={1, 2, 3, 5, 6, 7, 9, 10, 11, 13, 14, 15, 16, 17}

Obtain the masking matrix $$M_{q=8} = \begin{pmatrix} 01110100111011 \\ 10111011010110 \\ 11011100111001 \\ 11101011100110 \end{pmatrix}$$

Obtain the column permutation matrix $$\sigma_{q=8} = \begin{pmatrix} 1\,2\,3\,4\,5\,6\,7\,8\,9\,10\,11\,12\,13\,14 \\ 1\,2\,9\,10\,13\,14\,3\,6\,7\,12\,4\,5\,8\,11 \end{pmatrix}$$

3) Code III constructed based on q=10:
Select 4 rows from $B_{QR}$ to form $\tilde{B}_{4\times14}=\{j_1=1, j_2=2, j_5=9, j_6=13\}$
Select 14 columns from $B_{QR}$ to form $\tilde{B}_{4\times14}=\{1, 2, 3, 4, 5, 6, 7, 8, 10, 12, 13, 14, 16, 17\}$
Obtain the masking matrix $$M_{q=10} = \begin{pmatrix} 00100111111011 \\ 10001011111101 \\ 11111110000110 \\ 11111100001110 \end{pmatrix}$$

Obtain the column permutation matrix $$\sigma_{q=10} = \begin{pmatrix} 1\,2\,3\,4\,5\,6\,7\,8\,9\,10\,11\,12\,13\,14 \\ 1\,3\,9\,12\,13\,14\,4\,8\,10\,11\,2\,5\,6\,7 \end{pmatrix}$$

The error rates of constructed PBRL LDPC codes are simulated. Assume that all codes are transmitted over the additive white Gaussian noise (AWGN) channel using binary-phase-shift-keying (BPSK) modulation. The log-belief-propagation (log-BP) decoding algorithm is used, and the number of decoding iterations is set to 50. The block error rate (BLER) and bit error rate (BER) are computed after 100 block errors have been collected. The PBRL LDPC code is also simulated in the 5G proposal based on the base graph II.

As shown in FIG. 12A-C, FIG. 12A shows the error performance of the proposed (312, 60) PBRL LDPC code in this specification (i.e. code I) and the (312, 60) 5G LDPC code based on the base graph II, wherein during code construction the set index is assigned as $i_{ls}=1$, and LDPC lifting size is assigned as $Z_c=6$; FIG. 12B shows the error performance of the proposed (416, 80) PBRL LDPC code in this specification (i.e. code II) and the (416, 80) 5G LDPC code based on the base graph II, wherein during code construction the set index is assigned as $i_{ls}=0$, and LDPC lifting size is assigned as $Z_c=8$; and FIG. 12C shows the error performance of the proposed (416, 80) PBRL LDPC code in this specification (i.e. code II) and the (416, 80) 5G LDPC code based on the base graph II, wherein during code construction the set index is assigned as $i_{ls}=2$, and LDPC lifting size is assigned as $Z_c=10$.

It can be concluded that the constructed LDPC codes based on this specification outperform the LDPC codes in the 5G proposal in terms of BLER and BER. In particular, the constructed LDPC codes based on this specification outperform the 5G counterparts by about 0.5 dB at a bit error rate of $10^{-5}$.

It should be noted that the beneficial effects of different embodiments may be different. In some embodiments, possible beneficial effects may be any one or more of the above mentioned or any other beneficial effects.

The above describes the present specification and/or some examples. According to the above, different modifications may be made to this specification. The subject disclosed in this specification may be implemented in different forms and examples, and this specification may be applied in a large number of applications. All applications, modifications, and variations claimed by the claims are within the scope of this specification.

This specification uses specific terms to describe the embodiments of the present specification. The terms "one embodiment", "an embodiment", and/or "some embodiments" relates to a certain feature, structure, and/or characteristic of at least one embodiment of the present specification. Thus, it should be noted that two or more references in different places to the terms "one embodiment", "an embodiment", "an alternative embodiment", or "another embodiment" do not necessarily refer to the same embodiment. Furthermore, certain elements, structures, and/or features of one or more embodiments of the present specification may be combined.

For those skilled in the art, various variations and modifications may be made to the contents disclosed in this specification. For example, the different system components described above are implemented by hardware devices, yet they may also be implemented by software solutions only. For example, the system can be installed on an existing server. Furthermore, the supply of location information as disclosed herein may be implemented by a firmware, a combination of firmware and software, a combination of firmware and hardware, or a combination of hardware, firmware, and software.

All or a portion of software communicates through a network at times, such as the internet or other communication networks. Such communication may load and transmit software from one computer device or processor to another. A medium capable of transmitting software elements may also be used as a physical connection between local devices, such as optical waves, radio waves, electromagnetic waves, etc., and the transmission may be via cable, optical cable, or air. Physical mediums for carrying waves such as cable, wireless connection, or optic cable may also be used to carry software. Unless clearly limited to a specific tangible storage medium, terms referring to a computer or machine-readable medium represent the media involved in the process of performing any instructions.

The computer program encoding required by parts of this specification may be written in any one or more programming languages, including object-oriented programming languages (e.g., Java, Scala, Smalltalk, Eiffel, Jade, Emerald, C++, C#, VB. NET, and Python), conventional procedural programming languages (e.g., the "C" programming language, Visual Basic, Fortran 2003, Perl, COBOL 2002, PHP, and ABAP), and dynamic programing languages (e.g., Python, Ruby and Groovy), or the like. The program code may be executed entirely on the user's computer, on the user's computer as a stand-alone software package, partly on the user's computer and partly on a remote computer, or entirely on a remote computer or a server. In the subsequent case, the remote computer may be connected to the user computer through any network, for example, a local area network (LAN), a wide area network (WAN), connected to an external computer (e.g., through the Internet), in the cloud computing environment, or acts as a cloud computing environment Services such as Software, SaaS. In the latter scenario, the remote computer may be connected to the user's computer through any type of network, such as a local area network (LAN), a wide area network (WAN), a connection to an external computer (e.g., the internet), a cloud computing environment, or a service like the Software as a Service (SaaS).

Moreover, unless otherwise specified in the claims, the recited order of processing elements or sequences, as well as the use of numbers, letters, or other designations, is not intended to limit the sequences of processes and methods in this specification. Although the above disclosure discussed some embodiments of the invention that are considered useful by way of examples, it should be understood these details are merely intended to be illustrative, and the appended claims are not limited to the disclosed embodiments. On the contrary, the claims are intended to cover all modifications and equivalents within the spirit and scope of the present specification. For example, although the various system components described above may be implemented by a hardware device, it may also be implemented by a software only solution, such as installing the described system on an existing server or mobile device.

Similarly, it should be noted that in the foregoing description of embodiments of the present disclosure, various features are sometimes grouped together in a single embodiment, figure, or description for the purpose of streamlining the disclosure aiding in the understanding of one or more of the various embodiments. This method of disclosure, however, is not to be interpreted as reflecting an intention that the claimed subject matter requires more features than those expressly recited in each claim. Rather, the claim subject matter lies in less than all features of a single foregoing disclosed embodiment.

Each of the patents, patent applications, patent application publications and/or other materials (e.g., articles, books, instructions, publications, documents, and objects) referenced by this specification is hereby incorporated by reference in full in this specification as references. Older application documents of this specification that conflict or are inconsistent of the current disclosure are excluded from being incorporated by reference, if any. Documents that are limiting the widest scope of the claim of this specification (either currently present or later added into this specification) are also excluded from being incorporated by reference, if any. It should be noted that descriptions, definitions and/or the use of terms in this specification take precedence over those in appended documents if inconsistency and/or conflict arises.

Finally, the embodiments described herein are only intended to illustrate the principles behind the embodiments of the present specification. Modifications may also be within the scope of this specification. Thus, for a non-limiting example, an alternative configuration of the embodiments of the present specification may be regarded as being consistent with the teachings of the present specification. Accordingly, the embodiments of this specification are not limited to the embodiments distinctly described and introduced in this specification.

We claim:

1. A method for decoding and encoding LDPC codes for a wireless communication channel, the method being executed by a computing device which includes an LDPC channel decoder and an LDPC channel encoder, the method comprising:
the LDPC channel encoder receiving a base matrix of a Protograph-based Raptor-like (PBRL) LDPC code from a processor, wherein the processor constructs the base matrix of the PBRL LDPC code by:
determining at least one candidate sub-matrix of the PBRL LDPC code;
obtaining at least one count of cycles of at least one preset length for each of the at least one candidate base matrix;
determining a first sub-matrix of the base matrix of the PBRL LDPC code based on the at least one count of cycles; and
obtaining an optimized first sub-matrix by masking the first sub-matrix based on degree distributions of the PBRL LDPC code, wherein the degree distributions are determined by a Differential Evolution algorithm;
the LDPC channel encoder generating an encoded signal based on the base matrix of the PBRL LDPC code, and sending the encoded signal to the LDPC channel decoder over the wireless communication channel; and
the LDPC channel decoder generating and storing a check result of the PBRL LDPC code based on the encoded signal.

2. The method of claim 1, wherein the determining the first sub-matrix of the base matrix of the PBRL LDPC code based on the at least one count of cycles includes:
selecting a candidate sub-matrix corresponding to a minimum count of cycles of the at least one preset length as the first sub-matrix.

3. The method of claim 1, further including:
constructing a second sub-matrix of the PBRL LDPC code based on the optimized first sub-matrix, wherein a count of rows of the second sub-matrix is larger than a count of columns of the second sub-matrix.

4. The method of claim 3, further including:
determining a plurality of candidate check nodes of the second sub-matrix based on a plurality of extrinsic message degree of a plurality of variable nodes of the second sub-matrix using a tree structure;
determining a plurality of check nodes of the second sub-matrix based on the plurality of candidate check nodes using a Progressive Edge-Growth (PEG) algorithm;
obtaining the second sub-matrix based on the plurality of check nodes of the second sub-matrix.

5. The method of claim 4, further including:
obtaining a column permutation matrix based on a permutation rule;
obtaining the base matrix of the PBRL LDPC code by permuting the first sub-matrix and the second sub-matrix based on the column permutation matrix.

6. The method of claim 5, wherein the obtaining the base matrix of the PBRL LDPC code based on the column permutation matrix by permuting the first sub-matrix and the second sub-matrix includes:
determining punctured columns of the base matrix of the PBRL LDPC code based on the degree distributions of the PBRL LDPC code;
determining filler columns of the base matrix of the PBRL LDPC code based on at least one trap set of the first sub-matrix;
determining full-rank columns of the base matrix of the PBRL LDPC code based on a full-rank rule;
obtaining the column permutation matrix based on the punctured columns, the filler columns, and the full-rank columns.

7. A system for decoding and encoding LDPC codes for a wireless communication channel, comprising:

at least one non-transitory storage medium including a set of instructions, wherein the non-transitory storage medium is a tangible storage medium;

at least one processor in communication with the at least one storage medium, wherein when executing the set of instructions, the at least one processor is configured to direct the system to perform operations including:

constructing a base matrix of a Protograph-based Raptor-like (PBRL) LDPC code; wherein the constructing a base matrix of a PBRL LDPC code includes:

determining at least one candidate sub-matrix of the PBRL LDPC code;

obtaining at least one count of cycles of at least one preset length for each of the at least one candidate base matrix;

determining a first sub-matrix of the base matrix of the PBRL LDPC code based on the at least one count of cycles; and obtaining an optimized first sub-matrix by masking the first sub-matrix based on degree distributions of the PBRL LDPC code, wherein the degree distributions are determined by a Differential Evolution algorithm; and a computing device including an LDPC channel decoder and an LDPC channel encoder, wherein when executing the set of instructions, the computing device is configured to direct the system to perform operations including:

the LDPC channel encoder receiving the base matrix of the PBRL LDPC code from the at least one processor, and sending the encoded signal to the LDPC channel decoder over the wireless communication channel;

the LDPC channel encoder generating an encoded signal based on the base matrix of the PBRL LDPC code; and the LDPC channel decoder generating and storing a check result of the PBRL LDPC code based on the encoded signal.

8. The system of claim 7, wherein the determining the first sub-matrix of the base matrix of the PBRL LDPC code based on the at least one count of cycles includes:

selecting a candidate sub-matrix corresponding to a minimum count of cycles of the at least one preset length as the first sub-matrix.

9. The system of claim 7, further including:

constructing a second sub-matrix of the PBRL LDPC code based on the optimized first sub-matrix, wherein a count of rows of the second sub-matrix is larger than a count of columns of the second sub-matrix.

10. The system of claim 9, further including:

determining a plurality of candidate check nodes of the second sub-matrix based on a plurality of extrinsic message degree of a plurality of variable nodes of the second sub-matrix using a tree structure;

determining a plurality of check nodes of the second sub-matrix based on the plurality of candidate check nodes using a Progressive Edge-Growth (PEG) algorithm;

obtaining the second sub-matrix based on the plurality of check nodes of the second sub-matrix.

11. The system of claim 10, further including:

obtaining a column permutation matrix based on a permutation rule;

obtaining the base matrix of the PBRL LDPC code by permuting the first sub-matrix and the second sub-matrix based on the column permutation matrix.

12. The system of claim 11, wherein the obtaining the base matrix of the PBRL LDPC code based on the column permutation matrix by permuting the first sub-matrix and the second sub-matrix includes:

determining punctured columns of the base matrix of the PBRL LDPC code based on the degree distributions of the PBRL LDPC code;

determining filler columns of the base matrix of the PBRL LDPC code based on at least one trap set of the first sub-matrix;

determining full-rank columns of the base matrix of the PBRL LDPC code based on a full-rank rule;

obtaining the column permutation matrix based on the punctured columns, the filler columns, and the full-rank columns.

13. A non-transitory computer-readable storage medium, comprising a set of instructions, wherein when executed by at least one processor and a computing device, the set of instructions direct the computing device to perform a method for decoding and encoding LDPC codes for a wireless communication channel, the method comprising:

an LDPC channel encoder receiving a base matrix of a Protograph-based Raptor-like (PBRL) LDPC code from the at least one processor, wherein the at least one processor constructs the base matrix of the PBRL LDPC code by:

determining at least one candidate sub-matrix of the Protograph-based Raptor-like (PBRL) LDPC code;

obtaining at least one count of cycles of at least one preset length for each of the at least one candidate base matrix;

determining a first sub-matrix of the base matrix of the PBRL LDPC code based on the at least one count of cycles; and obtaining an optimized first sub-matrix by masking the first sub-matrix based on degree distributions of the PBRL LDPC code, wherein the degree distributions are determined by a Differential Evolution algorithm;

the LDPC channel encoder generating an encoded signal based on the base matrix of the PBRL LDPC code, and sending the encoded signal to the LDPC channel decoder over the wireless communication channel; and an LDPC channel decoder generating and storing a check result of the PBRL LDPC code based on the encoded signal.

* * * * *